(12) United States Patent
Gallant et al.

(10) Patent No.: US 6,977,055 B2
(45) Date of Patent: Dec. 20, 2005

(54) SECURING ELECTRICAL CONDUCTORS

(75) Inventors: Christopher M. Gallant, Nottingham, NH (US); Michel Labrecque, Manchest, NH (US); Mark A. Clarner, Concord, NH (US); John DeMain, Olney (GB)

(73) Assignee: Velcro Industries B.V., Curacao (AN)

( * ) Notice: Subject to any disclaimer, the term of this patent is extended or adjusted under 35 U.S.C. 154(b) by 0 days.

(21) Appl. No.: 10/423,816

(22) Filed: Apr. 25, 2003

(65) Prior Publication Data

US 2004/0016565 A1 Jan. 29, 2004

Related U.S. Application Data

(63) Continuation of application No. PCT/US01/46045, filed on Oct. 25, 2001.
(60) Provisional application No. 60/293,743, filed on May 25, 2001, provisional application No. 60/323,244, filed on Sep. 19, 2001, and provisional application No. 60/243,353, filed on Oct. 25, 2000.

(51) Int. Cl.[7] ............................ B29C 47/02; B29C 47/06
(52) U.S. Cl. ............. 264/167; 264/171.13; 264/272.14; 264/272.17
(58) Field of Search ................................. 264/166, 167, 264/171.13, 289.3, 272.14, 272.15, 272.17; 174/68.1, 250, 254, 72 R, 72 TR, 209, DIG. 33

(56) References Cited

U.S. PATENT DOCUMENTS

| | | | |
|---|---|---|---|
| 2,760,230 A | * | 8/1956 | Van Riper .................. 425/113 |
| 2,893,056 A | * | 7/1959 | Henning ..................... 118/405 |
| 3,857,397 A | | 12/1974 | Brosseau |
| 4,164,008 A | | 8/1979 | Miller et al. |
| 4,234,531 A | * | 11/1980 | Jocteur ....................... 264/169 |

(Continued)

FOREIGN PATENT DOCUMENTS

| | | |
|---|---|---|
| EP | 0813277 | 12/1997 |
| GB | 2256977 | 12/1992 |
| JP | 59196214 | 11/1984 |
| JP | 2000333709 | 12/2000 |
| JP | 2001291433 | 10/2001 |
| JP | 2003299506 | 10/2003 |

*Primary Examiner*—Angela Ortiz
(74) *Attorney, Agent, or Firm*—Fish & Richardson P.C.

(57) ABSTRACT

An elongated electrical cable or flexible circuit board includes an electrically conductive path and an insulating body encompassing and electrically isolating the conductive path, the insulating body including an exposed surface having an array of fastener elements extending therefrom, the fastener elements arranged and constructed to engage mating fastener elements associated with a supporting surface to selectively secure the cable or flexible circuit board to the supporting surface. The fastener elements can be loop-engageable fasteners and/or loops. Such a cable or flexible circuit board is continuously formed by introducing an electrical insulating material including a thermoplastic resin into a gap formed adjacent a peripheral surface of a rotating mold roll, the mold roll defining an array of cavities therein, the insulating material being introduced under pressure and temperature conditions selected to cause the insulating material to at least partially fill the cavities to form fastener element stems integrally with and extending from one broad side of a strip of said insulation material; while introducing conductive wires and/or a conductive path formed on or within a substrate to the gap so as to cause the insulating material to envelop and electrically isolate the conductive path and/or to cause the conductive path to become an integral part of the strip of insulation material from which the fastener element stems extend.

21 Claims, 20 Drawing Sheets

U.S. PATENT DOCUMENTS

| | | | |
|---|---|---|---|
| 4,281,211 A | * 7/1981 | Tatum et al. | 174/36 |
| 4,285,648 A | * 8/1981 | Jocteur | 425/97 |
| 4,468,435 A | * 8/1984 | Shimba et al. | 428/383 |
| 4,602,191 A | 7/1986 | Davila | |
| 4,794,028 A | 12/1988 | Fischer | |
| 4,863,541 A | * 9/1989 | Katz et al. | 156/158 |
| 5,260,015 A | * 11/1993 | Kennedy et al. | 264/167 |
| 5,310,964 A | * 5/1994 | Roberts et al. | 174/121 A |
| 5,455,749 A | 10/1995 | Ferber | |
| 5,569,549 A | 10/1996 | Redford | |
| 5,643,651 A | * 7/1997 | Murasaki | 428/100 |
| 5,716,574 A | * 2/1998 | Kawasaki | 264/171.17 |
| 5,763,112 A | 6/1998 | Redford | |
| 5,938,997 A | * 8/1999 | Sakakibara et al. | 264/167 |
| 5,945,193 A | 8/1999 | Pollard et al. | |
| 5,948,337 A | * 9/1999 | Sakakibara et al. | 264/167 |
| 6,036,259 A | 3/2000 | Hertel et al. | |
| 6,210,771 B1 | 4/2001 | Post et al. | |
| 6,540,863 B2 | 4/2003 | Kenney et al. | |
| 6,604,264 B1 | * 8/2003 | Naohara et al. | 24/444 |
| 6,668,380 B2 | 12/2003 | Marmaropoulos et al. | |
| 6,697,262 B2 | 2/2004 | Adams et al. | |
| 2004/0131823 A1 | 7/2004 | Rodgers et al. | |

\* cited by examiner

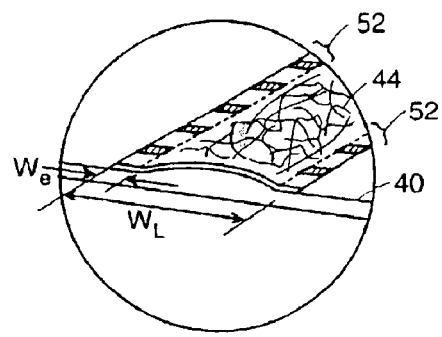 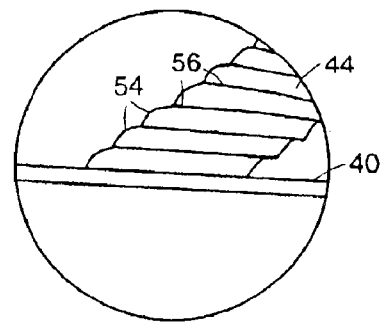
FIG. 8A  FIG. 8B
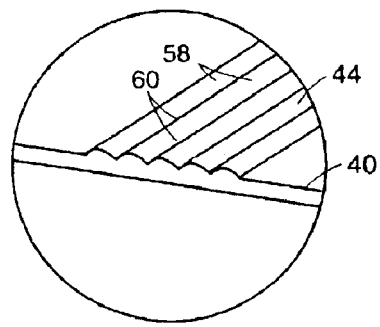 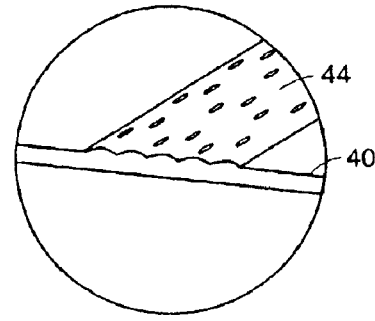
FIG. 8C  FIG. 8D
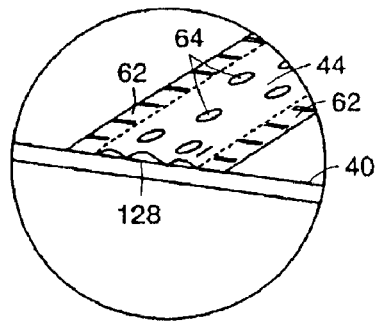
FIG. 8E

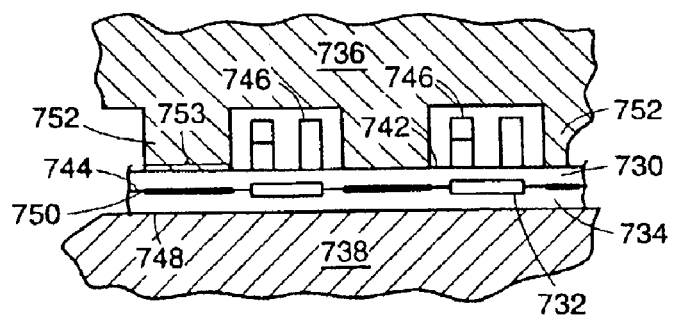
FIG. 33
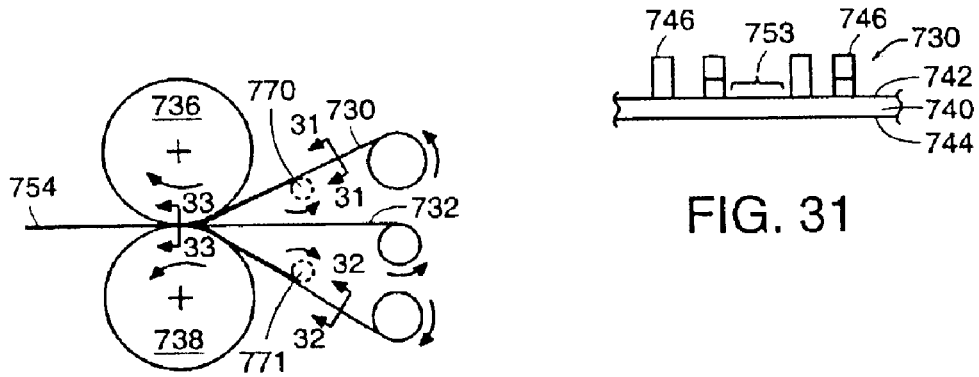
FIG. 31
FIG. 30
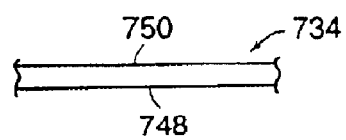
FIG. 32
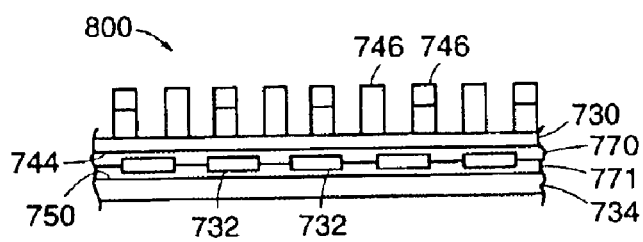
FIG. 34

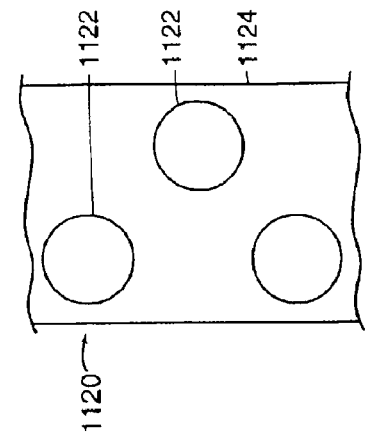
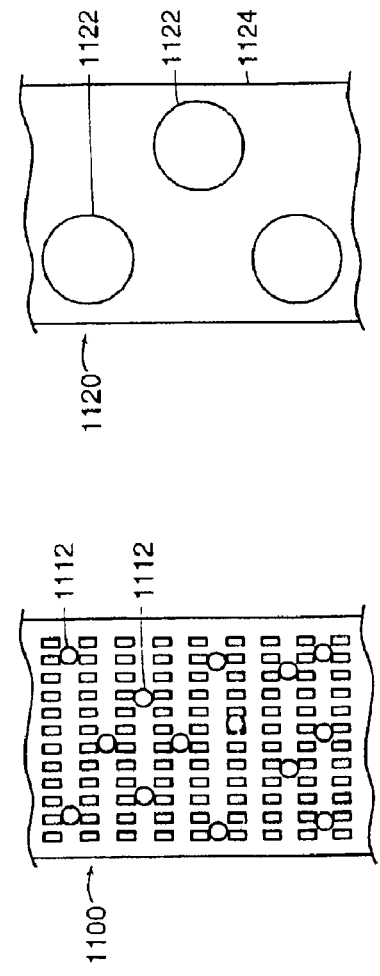
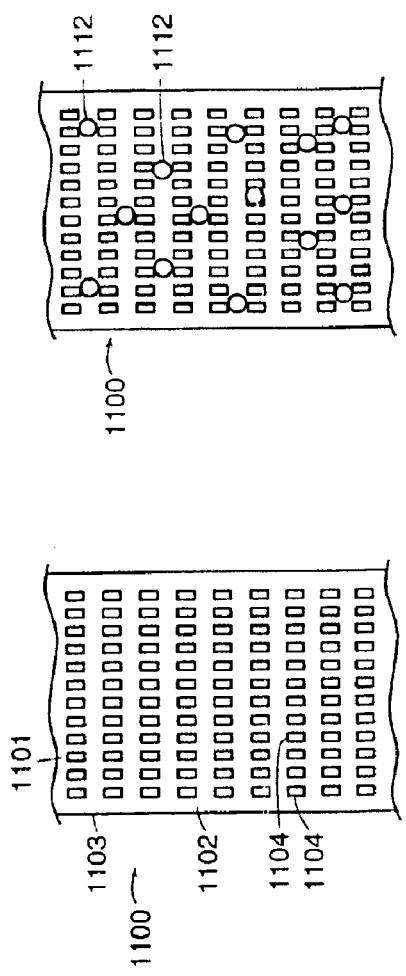
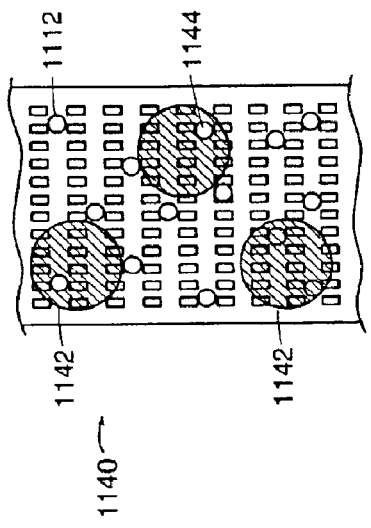
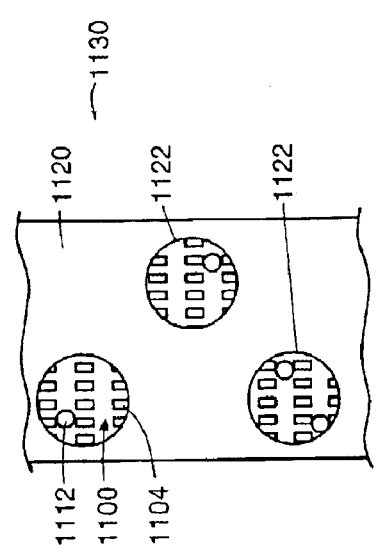

SECURING ELECTRICAL CONDUCTORS

CROSS-REFERENCE TO RELATED APPLICATIONS

This application is a continuation of and claims priority under 35 U.S.C. §120 to PCT Application Serial No. PCT/US01/46045, filed Oct. 25, 2001, which claims priority to U.S. Provisional Application Ser. No. 60/293,743, filed May 25, 2001, U.S. Provisional Application Ser. No. 60/323,244, filed Sep. 19, 2001, and U.S. Provisional Application Ser. No. 60/243,353, filed Oct. 25, 2000, the entire contents of all four being hereby fully incorporated by reference.

TECHNICAL FIELD

This invention relates to electrical cables and circuits, and more particularly, to electrical cables and flexible circuits incorporating hook and/or loop fasteners.

BACKGROUND

The use of electrical wires, cables and circuits throughout the world has become increasingly prevalent. With this growth has come the need to controllably direct and secure the routing of such conductors and processors to avoid electrical injury to people and to protect the electrical connections formed by such conductors from being inadvertently disconnected or worn during assembly and use.

For example, it is common in the automotive and other industries to position electrical cables, e.g., dome lamp cables, on the "non-show" surface (the surface not visible to vehicle passengers) of trim panels, e.g., headliners, to provide power for accessories, e.g., a dome lamp positioned within the headliner. Often it is desirable to secure such electrical cables in place to locate cable terminals for connection after trim panel installation and to prevent noise and cable fatigue associated with cable movement during the life of the assembly.

Ribbon cables, for example, are often employed within computers and other electronic devices where it is advantageous to secure the cables to, e.g., side panels, for ease of assembling other internal components, to avoid damage to the cables during assembly, and to reduce movement of the cables during use of the products to avoid wear and fatigue.

Electrical circuit boards and appliances often include a great number of electrical components interconnected for communication of electrical signals. Such interconnections typically require reliable connectors conducive to electrical conductivity that are installed and assembled by various means including, for example, soldering or plug and socket type engagement. These methods of installation and assembly often require precise alignment of mating pieces that are difficult to move and adjust when reconnection is required after initial assembly. It would be helpful if the fasteners provided secure yet releasable attachment and if they allowed for quick and efficient assembly without requiring precise alignment of the components to be interconnected.

Furthermore, it is common to secure electrical cables within the housings of computer hardware and peripheral equipment, within appliance housings and behind trim panels of automobiles by using various straps, adhesives, and other fastening materials and techniques. Often, electrical cables are secured in place to locate cable terminals for connection after trim panel installation and to prevent noise and cable fatigue associated with cable movement during the life of the assembly. Touch fasteners provide a convenient means of securing cables to side panels, for example, for ease of assembling other internal components, to avoid damage to the cables during assembly, and to reduce wear-inducing movement of the cables during use of the products.

SUMMARY

The invention features a cable or flexible circuit board with permanently attached fastener means extending along its length for securing the cable to a supporting surface.

According to one aspect of the invention, an elongated electrical cable includes at least two electrical conductors extending longitudinally along the cable and an insulating body encompassing and electrically isolating the conductors from one another, the insulating body including an exposed surface having an array of fastener elements extending therefrom, the fastener elements arranged and constructed to engage mating fastener elements associated with a supporting surface to selectively secure the cable to the supporting surface.

Variations of this aspect of the invention may include one or more of the following features. The fastener elements are shaped to engage exposed loop fibers associated with the supporting surface. The exposed surface of the insulating body includes a first broad surface of thermoplastic resin, the array of fastener elements being made up of raised projections of the thermoplastic resin. The exposed surface further includes a second broad surface of thermoplastic resin, a second array of fastener elements made up of raised projections of the thermoplastic resin extending from said second broad surface. The array of fastener elements is substantially coextensive with the first broad surface of the insulating body. The field of fastener elements forms a longitudinal band of fastener elements extending between lateral edge regions of the cable, the lateral edge regions being void of said fastener elements. The elongated electrical cable has an entire thickness, measured from distal ends of the fastener elements to an exposed broad surface of the insulating body opposite the fastener elements, of less than about 0.050 inch. The entire thickness is less than about 0.03 inch. The insulating body is a laminate, the laminate including a first and a second layer of thermoplastic resin and an adhesive layer disposed therebetween, the first layer defining a first broad surface of the exposed surface, the second layer defining a second broad surface of the exposed surface, the array of fastener elements being made up of raised projections of the thermoplastic resin of at least one of the first and the second broad surfaces. The insulating body is a unitary structure of thermoplastic resin, the unitary structure defining a first and a second broad surface of the exposed surface, the array of fastener elements being made up of raised projections of the thermoplastic resin of at least one of the first and the second broad surfaces. The insulating body includes a first and a second layer of thermoplastic resin with the conductors disposed therebetween, the first and second layers being permanently welded to one another in a manner to encompass and electrically isolate the conductors from one another, the array of fastener elements being made up of raised projections of the thermoplastic resin of an exposed surface of one of the first and second layers.

Yet additional features of this aspect of the invention may include one or more of the following. The fastener elements are exposed loop fibers. The insulating body includes a thermoplastic resin and the exposed loop fibers are part of a web of fibers, the web being attached to the insulating body by encapsulation of fibers of the web by the thermoplastic resin. The web of fibers is a nonwoven material. The elongated electrical cable defines a fixed cable length between opposite longitudinal ends, the cable further including an electrical connector electrically attached to at least one of the conductors and mechanically attached to the cable at one of the longitudinal ends.

In another aspect, the invention provides a releasably securable ribbon cable extending to define a longitudinal direction, the cable including a plurality of longitudinally extending electrical conductors, an insulating body encompassing and electrically isolating the plurality of conductors from one another, and a strip of loop-engageable fastener elements formed of thermoplastic resin, the strip extending longitudinally along the ribbon cable and being permanently attached to a surface of the insulating body such that the fastener elements are exposed for engagement with a loop material.

Another aspect of the invention provides a method of continuously forming an electrical cable, the method including:

introducing an electrical insulating material comprising a thermoplastic resin into a gap formed adjacent a peripheral surface of a rotating mold roll, the mold roll defining an array of cavities therein, the insulating material being introduced under pressure and temperature conditions selected to cause the insulating material to at least partially fill the cavities to form fastener element stems integrally with and extending from one broad side of a strip of said insulation material; while introducing at least two longitudinally continuous and spaced apart electrical conductors to the gap so as to cause the insulating material to envelop and electrically isolate the conductors and cause the conductors to become an integral part of the strip of insulation material from which the fastener element stems extend.

Variations of this aspect of the invention may include one or more of the following features. The cavities of the mold roll are shaped to mold distal heads on the fastener element stems, the distal heads being shaped to overhang the broad side of the strip of insulating material so as to be engageable with exposed loop fibers. Each of the stems defines a tip portion, the method further comprising deforming the tip portion of a plurality of the stems to form engaging heads overhanging the broad side of the strip of insulating material, the engaging heads being shaped to be engageable with exposed loop fibers. The gap is a nip defined between the rotating mold roll and a counter-rotating pressure roll. The gap is a nip defined between the rotating mold roll and a counter-rotating mold roll, each of the rotating mold roll and the counter-rotating mold roll defining an array of cavities therein, the insulating material being introduced under pressure and temperature conditions selected to cause the insulating material to at least partially fill the array of cavities of each of the rotating and the counter-rotating mold roll to form fastener element stems integrally with and extending from each of opposite broad sides of the strip of the insulation material. The insulating material includes a layer of thermoplastic resin and a film backing carrying the electrical conductors on a surface thereof, the layer of thermoplastic resin being introduced to the gap directly adjacent the rotating mold roll, the film backing carrying the electrical conductors being introduced to the gap under pressure and temperature conditions which cause the film backing to become permanently bonded to the thermoplastic resin to envelop and electrically isolate the conductors. The insulating material includes a first and a second film of thermoplastic resin, wherein the electrical conductors and the first and second films are introduced to the gap with the electrical conductors disposed between the first and the second film, said first film being introduced directly adjacent the rotating mold roll under temperature and pressure conditions that cause the first and second films to become permanently bonded to each other in a manner enveloping and electrically isolating the conductors. The method includes, downstream of the gap, longitudinally severing the electrical insulation material after solidification to form two electrical cables, each cable containing at least one conductor.

In another aspect, the invention provides a method of continuously forming an electrical cable, the method including:

introducing molten resin into a nip formed between a rotating mold roll and a counter-rotating pressure roll, the mold roll having a peripheral surface defining an array of blind molding cavities therein, under pressure and temperature conditions selected to cause the resin to fill the mold cavities and form an array of fastener element stems integrally molded with and extending from a broad strip of resin; while simultaneously introducing a preformed electrical ribbon-type cable to the nip adjacent the pressure roll, such that the broad strip of resin becomes permanently bonded to a broad side of the ribbon-type cable on a side opposite the fastener element stems.

In another aspect of the invention, a method of continuously forming an electrical cable includes:

providing a fastener tape of continuous length, the fastener tape comprising a base and an array of loop-engageable fastener elements, the base being of thermoplastic resin and defining a first and a second opposite broad surface, the array of loop engageable fastener elements comprising protrusions of the thermoplastic resin of the first surface;

arranging a backing film of continuous length adjacent the fastener tape, the backing film defining a broad surface, the broad surface of the backing film being arranged to face the second broad surface of the fastener tape;

disposing a plurality of spaced apart electrical conductors of continuous length between the second broad surface of the fastener tape and the broad surface of the backing film; and disposing a layer of electrically insulating adhesive between the second broad surface of the fastener tape and the broad surface of the backing film to cause the layer of adhesive to electrically isolate the plurality of conductors from one another while permanently bonding the fastener tape to the backing film to envelop the plurality of conductors therebetween.

In another aspect of the invention, a method of forming an electrical cable includes:

introducing a strip of molten electrical insulation material into a gap formed adjacent a peripheral surface of a rotating roll; while introducing a continuous strip of loop material to the gap along the surface of the roll, under conditions selected to cause the loop material to become at least partially embedded in the electrical insulation material to bond the loop material to the resin while leaving hook-engageable fiber portions exposed for engagement; and introducing at least two longitudinally continuous and spaced apart electrical conductors to the gap so as to cause the insulating material to envelop and electrically isolate the conductors in the gap to form a multi-conductor electrical cable having engageable loops extending from an outer surface thereof.

Cables (or wires) having integral fastening means can obtain numerous advantages. For example, continuous lengths of such fastener-bearing cable can be cut to any desired length and still retain its fastening properties. Additionally, the conductors can provide longitudinal reinforcement for the fastener base. The cable can be fashioned with a very low overall thickness, providing flexibility for easy routing, low bulkiness and associated material cost, and ease of cable concealment (e.g., for routing behind automotive interior panels). Furthermore, the invention can provide a fastenable cable without the structural redundancy of the fastener base and cable insulator.

In another aspect of the invention, a strip-form layer of electrical insulation having a pattern or circuit of conductive material disposed on one surface thereof (or fully insulated thereby, as in a flexible cable containing circuitry components) is fed through a hook-forming nip as described with reference to any of the above methods to form a hook-bearing layer integrally with the strip-form layer of electrical insulation.

In yet another aspect, the invention is a product formed by the method described immediately above.

In another aspect, the invention provides a flexible circuit board including a substrate having first and second, opposite broad surfaces, and a through-hole surface extending from the first to the second broad surface defining a passage between the first and second broad surfaces. The substrate further has an array of fastener elements extending from the first broad surface, the first broad surface and the array of fastener elements being formed integrally of a thermoplastic resin. A pattern of electrically conductive material is attached to the thermoplastic substrate, the pattern encompassing at least a portion of the through-hole surface.

This aspect of the invention may include one or more of the following features. The pattern of electrically conductive material is disposed only on the second broad surface and the at least a portion of the through-hole surface. The pattern of electrically conductive material is disposed only on the first broad surface and the at least a portion of the through-hole surface. The pattern of electrically conductive material encompasses at least a portion of the array of hook fastener elements. The pattern of electrically conductive material encompasses an entirety of the first or second broad surface.

In another aspect of the invention, an electrical cable includes a strip-form substrate having first and second, opposite broad surfaces and an array of fastener elements extending from the first broad surface. The first broad surface and the array of fastener elements are formed integrally of a thermoplastic resin, and a continuous strip of conductive material is attached to one of the first and second broad surfaces, the continuous strip being longitudinally coextensive with the strip-form substrate.

In another aspect of the invention, a method of forming an electrically conductive hook tape includes providing a substrate having first and second, opposite broad surfaces and an array of fastener elements extending from the first broad surface, the first broad surface and the array of fastener elements being formed integrally of a thermoplastic resin; applying a sensitizer to an exterior surface of the substrate; and applying a solution comprising a conductive material to the exterior surface where the sensitizer was applied, to produce a chemical reduction reaction between the conductive material and the sensitizer wherein the conductive material attaches to the exterior surface of the substrate.

Variations of this aspect of the invention may include one or more of the following features. A wetting agent is applied to areas of the substrate to be coated with the conductive material prior to application of the sensitizer. The sensitizer includes an anodic material that is disposed on the external surface of the substrate and the conductive material includes a cathodic material relative to the anodic material. The sensitizer comprises tin and the conductive material comprises silver. The solution further comprises an activator. The activator solution further comprises a reducer. The conductive material is applied to the first broad surface of the thermoplastic substrate. The conductive material coats at least a portion of the array of fastener elements. The method further includes a step of masking selected regions of the surface of the substrate prior to the step of applying sensitizer, thereby preventing attachment of the conductive material in the selected regions. The substrate further includes a through-hole surface extending between the first and second broad surfaces to define a passage. The conductive material is attached to at least a portion of the through-hole surface.

Another aspect of the invention provides a method of forming a flexible circuit board with integral hook fastener elements, the method including introducing an elongated flexible circuit including a substrate and at least one electrically conductive path to a gap adjacent a peripheral surface of a mold roll, the mold roll having hook fastener element stem forming cavities extending inwardly from the peripheral surface, while simultaneously, introducing a thermoplastic resin into the gap directly adjacent the peripheral surface under temperature and pressure conditions causing the thermoplastic resin to at least partially fill the stem forming cavities and to permanently bond to the substrate. Finally, the method includes stripping the permanently joined thermoplastic resin and substrate from the mold roll to expose the fastener element stems.

Variations of this aspect of the invention can include one or more of the following additional features. The conductive path is electrically insulated within the substrate prior to being introduced to the gap. A portion of the conductive path is exposed within the substrate for making an electrical connection with the conductive path. The portion of the conductive path is exposed prior to entering the gap. The portion of the conductive path is exposed by partial removal of the substrate after stripping the thermoplastic resin from the mold roll. The conductive path is disposed on an exterior surface of the substrate prior to being introduced to the gap, the thermoplastic resin being of an electrically insulating material, the conductive path being enveloped by the thermoplastic resin and the substrate. The conductive path is comprised of continuous strips of conductive material. The conductive path is comprised of discontinuous strips of conductive material that are electrically joined by electrical components.

In another aspect, the invention provides a securable flexible circuit including a carrier substrate of thermoplastic resin having a first broad surface and a second broad surface, the first broad surface being exposed and having an array of hook fastener elements protruding therefrom, the hook fastener elements formed as raised projections of the thermoplastic resin of the first broad surface, and an electrically conductive path disposed on said second broad surface.

Variations of this aspect of the invention can include one or more of the following features. The securable flexible circuit further includes a backing substrate having a first broad surface and a second broad surface, the backing substrate laminated to said carrier substrate with said electrically conductive path disposed between the second broad surface of the backing substrate and the second broad surface of the carrier substrate. The backing substrate includes an array of hook fastener elements protruding from the first broad surface thereof. The backing substrate defines through-holes extending from said backing strip first broad surface to said backing strip second broad surface, the through-holes exposing portions of the conductive path. The securable flexible circuit further includes a layer of adhesive disposed between the backing substrate and the carrier substrate for lamination. The through-holes extend through the layer of adhesive.

Electrically conductive hook fastener substrates of the present invention provide for effective transmission of electrical signals on a flexible medium that can be reliably and releasably secured to a surface having complementary fastening material. In the assembly of products that include electronic components, such hook fastener substrates can be used, for example, as electrical cables. Such cables offer the advantage of being readily secureable to walls or other surfaces having complementary fastener materials. This allows the cables to be routed and secured in a manner that avoids interference with subsequent assembly operations and also eliminates subsequent wear-causing movement of the installed cables that may occur during use of the assembled product.

Such flexible conductive hook fastener substrates can be efficiently and continuously formed with integral hook fastener elements according to certain methods and apparatus of the invention. These techniques allow for electrical conductivity along the substrate in a patterned arrangement, on one or more surface, and/or on the hook fastener members themselves, as desired. Furthermore, the resulting conductive hook fastener substrates provide a surface on which other electrical components can be attached to process, relay, or modify electrical signals carried along the substrate.

The conductive coating of the fastener product of the present invention may be applied as an advantageously thin layer. In certain embodiments, the conductive layer is of a thickness less than 0.0015 inches (0.038 mm), while in other embodiments the conductive layer is less than 0.0010 inches (0.025 mm). By applying a thinner conductive layer, less weight is added in making the fastener product conductive and less conductive material is expended.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 8A–8E illustrate various loop material attachment alternatives.

FIG. 30 is a schematic illustration of a portion of an alternative method for manufacturing an electrical cable of the present invention.

FIG. 31 is an unscaled, diagrammatic, cross-sectional view taken along line 31—31 of FIG. 30.

FIG. 32 is an unscaled, diagrammatic, cross-sectional view taken along line 32—32 of FIG. 30.

FIG. 33 is a magnified, diagrammatic, cross-sectional view taken along line 33—33 of FIG. 30.

FIG. 34 is an unscaled, diagrammatic, cross-sectional view similar to that of FIG. 29 of an alternative electrical cable of the present invention.

FIGS. 37A, 37B, 37D and 37E illustrate a hook fastener tape similar to that of FIG. 35 at various stages of the process illustrated in FIG. 36.

FIG. 37C illustrates a masking film for use in the process illustrated in FIG. 36 and used on the hook fastener tape of FIG. 37D.

FIGS. 41A and 411B illustrate a bottom and a side view, respectively, of a backing film, particularly for use with the cables/circuits of FIGS. 39A, 39B, 40A, 40B and 41.

Like reference symbols in the various drawings indicate like elements.

DETAILED DESCRIPTION

Figure 1:
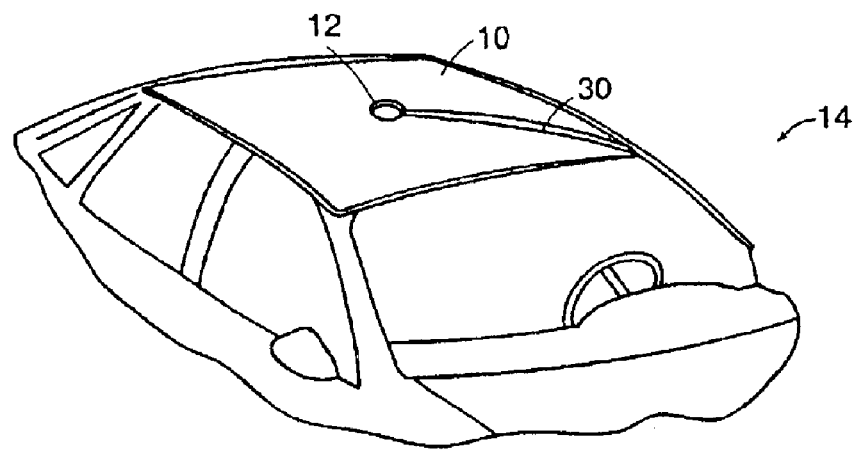
FIG. 1 illustrates an electrical cable assembly secured to a typical automobile headliner positioned within the cab of an automobile.
Figure 2:
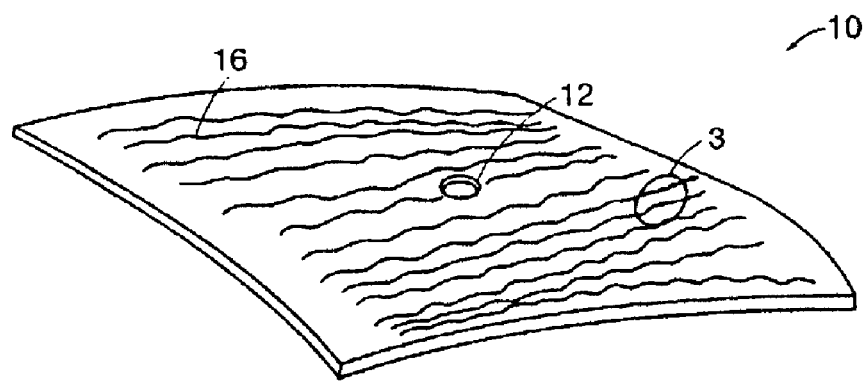
FIG. 2 illustrates the headliner of FIG. 1 with the electrical cable removed.
Figure 3:
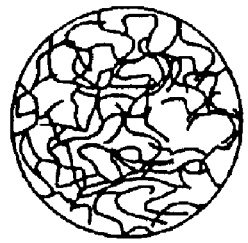
FIG. 3 is a highly enlarged view of area 3 of FIG. 2.

Referring to FIG. 1, automobile headliner 10 is positioned within automobile 14 (shown with roof panel removed in FIG. 1) so that dome lamp aperture 12 can receive a dome lamp (not shown). In order to provide electricity to the dome lamp while remaining out of view of automobile passengers for aesthetic and safety reasons, flat electrical cable 30 is secured along the "non-show" surface 16 of headliner 10. Referring now also to FIG. 2, non-show surface 16 of headliner 10 is of a loop material capable of being engaged by hook or mushroom shaped protrusions to form hook and loop engagement as described below. The loop material may be a non-woven, knit, or other fibrous material capable of engaging protrusions as described below, and may be of the same material as the opposite, "show" surface, of headliner 10. Alternatively, smaller patches (not shown) of loop material may be positioned on non-show surface 16 in areas selected for cable 30 attachment. As illustrated in FIG. 3, loop material on non-show surface 16 of headliner 10 is a non-woven mat of tangled fibers, which allow penetration and engagement by protrusions to achieve fastening. Suitable loop materials are further discussed below.

Figure 4:
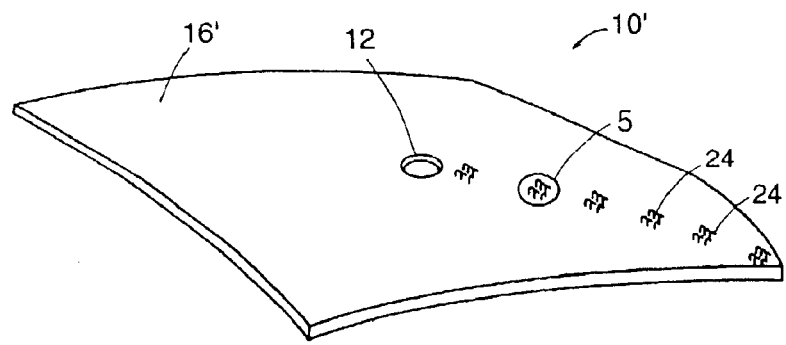
FIG. 4 illustrates a headliner similar to that of FIG. 2 with an alternative surface fastener.
Figure 5:
FIG. 5 is a highly enlarged view of area 5 of FIG. 3.

FIG. 4 illustrates an alternative arrangement wherein headliner 10' has a non-show surface 16' without engageable fibers or loops. Non-show surface 16' is instead provided with hook arrays 24 along the desired path for electrical cable securement. As illustrated in FIG. 5, hook arrays 24 consist of multiple individual hook-shaped protrusions which can be formed integrally with non-show surface 16 during manufacture of headliner 10' or can be applied with adhesive or otherwise after formation of headliner 10'. A suitable protrusion shape is the CFM29 hook shape (of about 0.015 inch in height, h (FIG. 7), available in various products sold by Velcro USA of Manchester, N.H. Alternative protrusion shapes, such as mushrooms, palm trees, flat-topped hooks, or other loop engageable shapes are also suitable. Hook height, h (FIG. 7), is typically within the range of 0.003 to 0.03 inch.

Figure 6:
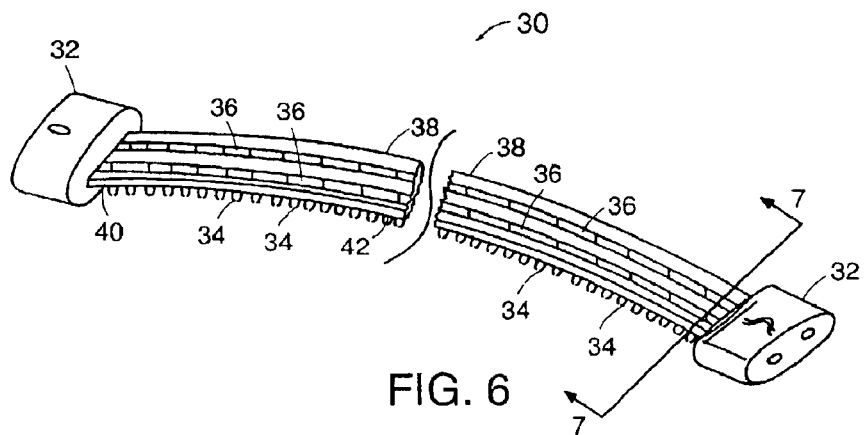
FIG. 6 illustrates the electrical cable assembly of FIG. 1 detached from the headliner.
Figure 7:
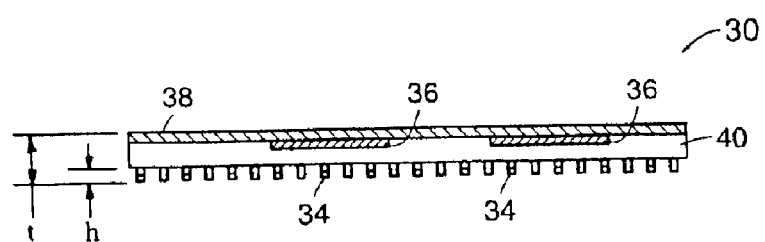
FIG. 7 is a cross-sectional view taken along line 7—7 of FIG. 6.

Electrical cables of the invention and their securement to a panel, e.g., headliners 10, 10', will now be described. As illustrated in FIG. 6, electrical cable 30 has a plastic base strip 40 carrying two attached flat conductive strips 36 for delivering electrical signals between terminal electrical connectors 32. Electrical connectors 32 are provided for connection to mating electrical connectors, e.g., a dome lamp connector and an A-pillar connector (not shown) to complete a desired electrical circuit. Securing surface 42 of electrical cable 30 has an array of hook-shaped protrusions 34, similar to those illustrated in FIG. 5 and described above, for engaging loop material of a mating panel, e.g., loop material of non-show surface "16 of headliner 10 as described above (FIGS. 2, 3). Hooks 34 are formed integrally from the same material as plastic base strip 40 as described below. As illustrated in FIG. 7, electrical cable 20 also includes a backing of electrical conductor insulator material 38 to protect and insulate conductors 36. The overall thickness, t, of cable 20, as measured from distal ends of the hooks to an exposed broad surface of the insulator backing 38 opposite the fastener elements, is typically much less than 0.10 inch. In fact, in most embodiments thickness t is less than 0.05 inch and in some embodiments, less than 0.03 inch.

Figure 8:
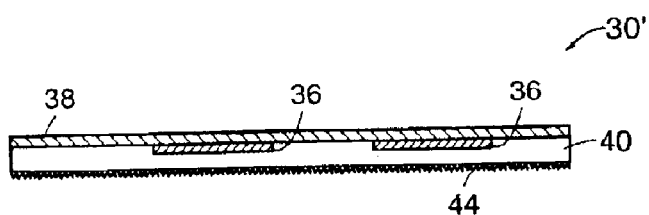
FIG. 8 is a cross-sectional view similar to that of FIG. 7, illustrating an alternative electrical cable for securing the headliner of FIG. 4.

FIG. 8 illustrates the cross-section of an alternative electrical cable 30', suitable for use with hook-bearing panels, e.g., headliner 10' (FIGS. 4 and 5). Plastic base strip 40 carries electrical conductors 36, insulation material 38, and exposed loop material 44 suitable for engagement by hooks similar to those illustrated in FIG. 5 and described above. In one embodiment loop material 44 is a non-woven mat of tangled fibers similar to those illustrated in FIG. 3 and described above. Suitable loop materials and methods and apparatus for their production are disclosed in U.S. patent application Ser. No. 09/262,159, filed Mar. 3, 1999, to which the reader is referred for further information. Other nonwoven, knit, or fibrous materials capable of engaging protrusions described above are also suitable.

Preferably, the non-woven loop material 44 is very thin, such as less than about 0.040 inch thick (more preferably, less than about 0.020 inch thick), with web fibers held in a transversely stretched condition and freestanding loop structures extending from its exposed surface. As discussed in the above-referenced patent application, the loop structures extend from associated knots in the stretched web, which may be stabilized by liquid binder wicked into the knots and cured. Between knots, the thin fiber mat is not very dense and is sheer enough to permit images to be readily seen through it. Overall, the loop material has a basis weight (in its preformed state, including any pre-applied binder) of less than about 4 ounces per square yard (136 grams per square meter), preferably less than about 2 ounces per square yard (68 grams per square meter). Other details of this loop material may be found in the above-referenced application. For applications in which the loop material is partially penetrated by resin of the substrate as the substrate is formed (as discussed below), the needled loop material is preferably only stretched in a transverse direction only about 22 percent to leave a fair amount of loft and avoid total penetration.

Some lightweight knits are also suitable loop materials for certain applications. Examples of such knits are Product 19902 from Guilford Knits in Greenville, S.C., which is of polyester fibers and has a basis weight of only about 1.6 ounces per square yard. For a heavier knit, Guilford's Product 20229, a nylon knit of about 3.3 ounces per square yard is suitable. Lightweight knit products are also available from TYBOR in Spain, and MIZARD in Italy.

In some instances, loop material 44 is partially encapsulated directly in resin of plastic base strip 40 as the substrate is formed in a continuous molding process (described below). In other cases, it is bonded to the formed substrate, either by ultrasonic bonding, welding, or adhesives.

FIGS. 8A through 8E illustrate various patterns of variable bonding between loop material 44 and substrate 40. For simplicity, electrical conductors 36 (FIG. 8) are not shown. The variable bonding patterns correspond, in some cases, to variable resin penetration into the web of the loop material, which may be achieved by employing different arrangements of staking rings and/or barrier materials between the loop material and substrate, both of which are discussed further below. In FIG. 8A, loop material 44 is only fully penetrated by substrate resin in narrow edge regions 52, and is less penetrated at its center. For instance, if loop material is about ¾ inch wide ($W_L$), then fully penetrated edge regions 52 may have a width ($w_e$) of only about ⅛ inch. The center region of the loop material is less penetrated and gently arches away from the substrate, presenting the loops for engagement. The inclined sides of the center arch can also help to enhance the peel strength of the fastening at the edges of the loop material, as they resolve a small component of the peel force in a tangential, or shear, direction.

The pattern of variable bonding shown in FIG. 8B creates transverse pillows 54 of relatively lightly bonded, or loose, loop material separated by transverse bands 56 of relatively more fully bonded (e.g., more deeply encapsulated) loop material. The loftiness of pillows 54 is exaggerated for illustration. This pattern enhances initial peel strength of the fastening, as the "free" pillow ends along the inner and outer edges of the loop material follow the mating fastener elements, e.g., hooks, during peel until they are separated in sheer.

FIG. 8C illustrates a bonding pattern with longitudinal pillows 58 of relatively lightly bonded, or loose, loop material, separated by longitudinal bands 60 of relatively more fully bonded (e.g., more deeply encapsulated) loop material. Again, the loftiness of the pillows is exaggerated for illustration. FIG. 8D is a variation of the pattern of FIG. 8C, with each longitudinal band of more fully bonded material separated into longitudinally alternating regions of light and heavy bonding. The regions of light and heavy bonding are staggered across the loop material, producing a checkerboard pattern of lofted loop pillows. FIG. 8E shows a bonding pattern with edge regions 62 of alternating light and heavy bonding, and a center region bonded in only isolated regions 64. The bonding patterns described above may be mixed and varied for different applications, as required.

Figure 9:
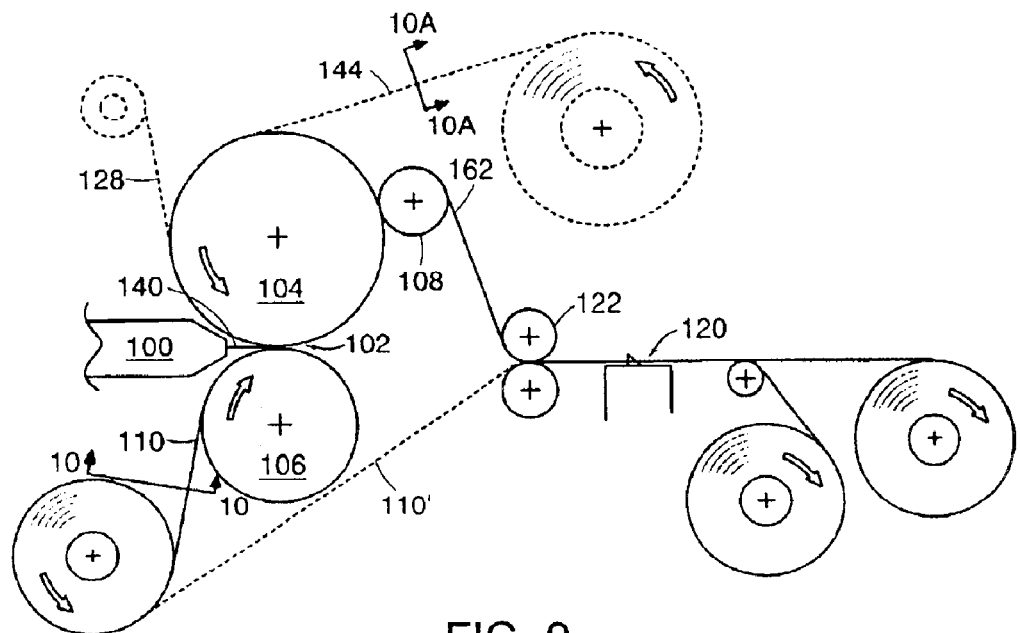
FIG. 9 illustrates a first method and apparatus for forming electrical cables with integral fasteners such as those illustrated in FIGS. 7 and 8.

FIG. 9 illustrates multiple methods and apparatus for producing the above described electrical cables. The methods build upon the continuous extrusion/roll-forming method for molding fastener elements on an integral, sheet-form base described by Fischer in U.S. Pat. No. 4,794,028, and the nip lamination process described by Kennedy et al. in U.S. Pat. No. 5,260,015. The reader is referred to both of these publications for further information. The relative position and size of the rolls and other components is not to scale. An extrusion head 100 supplies a continuous sheet of molten resin 140 to a nip 102 between a rotating mold roll 104 and a counter-rotating pressure roll 106 (nip arrangement illustrated in FIG. 9A). Mold roll 104 contains an array of miniature, fastener element shaped mold cavities 134 extending inward from its periphery for molding the fastener protrusions, e.g. 34 (FIG. 7). Pressure in nip 102 forces resin into the fastener element cavities and forms the substrate (base 40, FIGS. 7, 8). The formed product is cooled on the mold roll until the solidified fastener elements (e.g., hooks) are stripped from their fixed cavities by a stripper roll 108. Along with the molten resin, a continuous strip of electrical conductor product 110 (illustrated in cross-section in FIG. 10), including insulator tape 38 with attached electrical conductor strips 36 is fed into nip 102, where it is bonded with resin 140 and becomes permanently secured to the front face of the substrate 40. Thus, the product 162 that is stripped from the mold roll 104 includes both fastener elements 34 and electrical conductor strips 36 as illustrated, for example, in FIG. 7 described above.

For higher production rates, two or more electrical cables may be simultaneously produced on a single mold roll, and later split and spooled. Referring again to FIG. 10, continuous strip of electrical conductor product 110 is provided having two (or more, if desired) electrical cable profiles joined side by side (a second cable profile indicated by dashed lines in FIG. 10), each cable profile bearing the desired number and arrangement of conductive strips 36. The electrical conductor product is fed into nip 102 and molten resin is introduced across the entire nip, impregnating and forming hooks along the entire multiple-cable-width strip of electrical conductor product 110. A protruding splitting channel ring 118 (FIG. 9A) (or multiple rings if more than two profiles are provided) at the center of the mold roll (or spaced according to the width of the individual cable profiles) produces a splitting channel in the product, along which the resulting tape is split by a blade 120 (FIG. 9; either stationary or rotating) into two (or more) separate runs of electrical cable which are separately spooled.

FIG. 9 indicates several variations of the above-described method. For instance, rather than introduce the electrical conductor product 110 through nip 102 and thereby join it to the substrate as the substrate is molded, the electrical conductor product may be joined to the substrate after the substrate has been formed, such as is indicated by the run 110' of electrical conductor product shown in dashed outline. In this case, front face idler 122 is heated and has a contoured surface to bond the electrical conductor product and the substrate in desired areas while not damaging the molded hooks.

FIG. 9 also illustrates a method and apparatus for producing a flat electrical cable having engageable loops on one surface for cable securement, as for example the electrical cable illustrated in FIG. 8 and described above. In this method, electrical conductor product 110 is fed into nip 102 along with extruded resin 140. Nip 102 is formed between mold roll 104 and pressure roll 106, but in this embodiment, mold roll 102 lacks element-forming mold cavities. A continuous strip of loop material 144, illustrated in FIG. 10A and, for example, as described above in reference to FIGS. 8, is simultaneously fed into nip 102. The electrical conductor product 110 and the loop material 144 are bonded to the resin of the substrate by pressure in the nip 102.

Figure 9A:
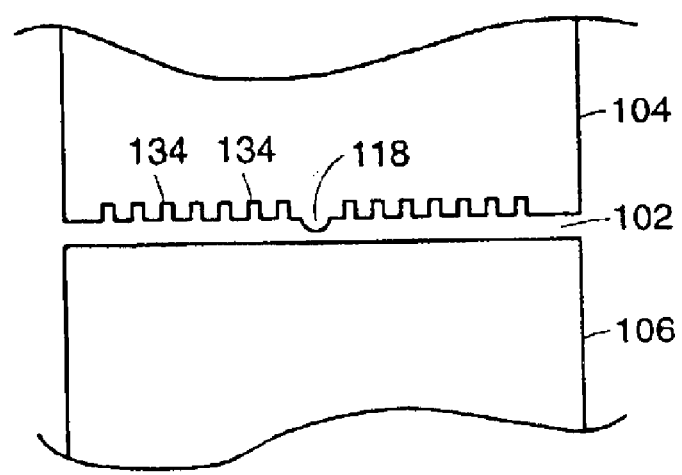
FIG. 9A is an enlarged view of the forming nip of the apparatus of FIG. 9.
Figure 11:
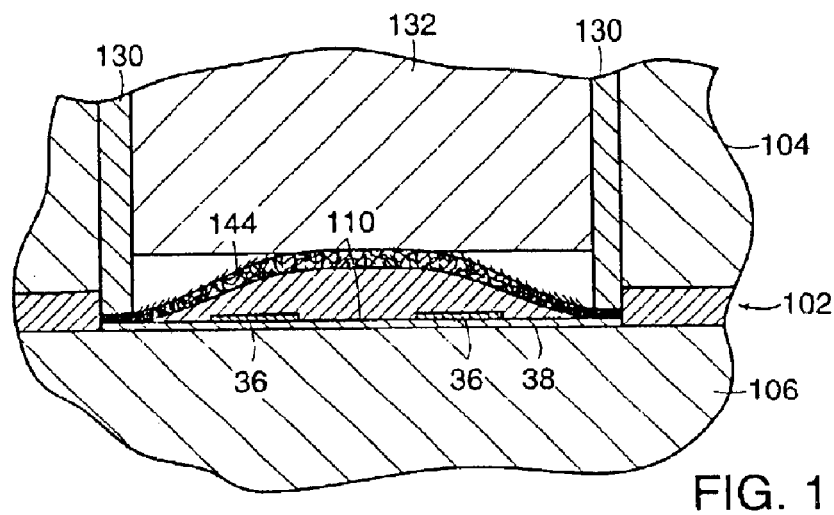
FIG. 11 is a highly enlarged view of the loop material-securing region of the nip.

Applying even pressure across nip 102 may lead to excessive resin penetration, or "flooding" of the loop material 144, which may reduce loop loft and have an adverse effect on fastener performance. In one embodiment, to avoid excessive resin penetration, mold roll 104 has staking rings 130 (FIG. 11) of increased diameter relative to a central portion(s) 132 of mold roll 104 to engage and locally hold the edges of the insulator material of the conductor product and the loop material against the extruded resin as the resin forms the substrate under nip pressure, thereby ensuring heavy penetration of the insulator and loop materials in predetermined areas along the cable edges. This configuration shown in FIG. 11 produces the bonding pattern illustrated in FIG. 8A, the staking rings 130 forming heavily bonded edge regions 52 corresponding to the width of mold roll staking rings 130. If multiple cable strips are being produced simultaneously on the same mold roll, multiple sets of such staking rings can be employed to heavily penetrate the conductor product and loop material adjacent to each splitting ring 118 (FIG. 9A, described above). Alternatively or additionally, the mold roll may be provided with a pattern or series of protruding surfaces to form a pattern of heavily bonded areas across each cable product. These, heavily bonded areas can be formed by such rings or protrusions on the mold ring, the pressure ring or a combination of both.

Figure 12:
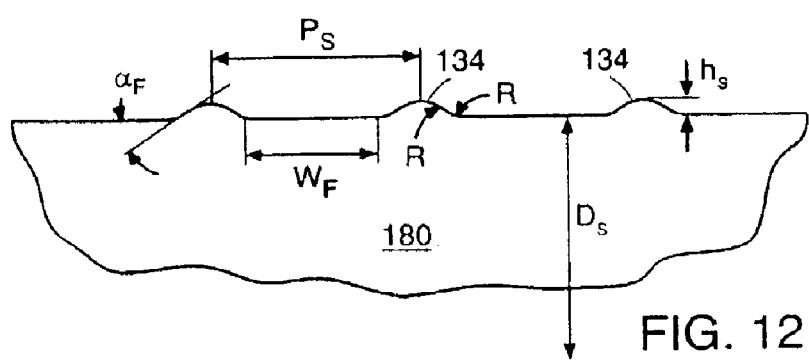
FIG. 12 is an enlarged view of the outer edge of a staking ring.

To form a row of heavily bonded points separated by regions of lower resin penetration, some staking rings 130 have a contoured outer edge as shown in FIG. 12. A series of protrusions 134 extending beyond the nominal diameter $D_s$ of the staking ring cause the resin to locally penetrate farther into the loop material. In this example configuration, $D_s$ is 9.968 inches, the height ($h_s$) of each protrusion 134 is 0.014 inch, and the inner and outer radii (R) at the flank of each protrusion is 0.015 inch. The protrusion pitch ($P_s$) is 0.202 inch, and the length of the flat between protrusions ($w_f$) is 0.130 inch. The dimensions of the protrusions are selected to attempt to optimize the maximum approach angle $\alpha_f$ of the protrusion flank with respect to a local ring tangent. A steep approach angle (i.e., an abrupt change in ring diameter) can cause a sharp local increase in nip pressure and an undesirable local flooding of the front side of the loop material with resin. Such flooded areas can create local "depth stops" to mating fastener elements, reducing the fastener element penetration into the loop material. A zero approach angle (i.e., no protrusions) would result in a homogeneous resin penetration beneath the staking ring, which may not be as desirable as local loop material "pillowing" (discussed above) in some applications. The maximum approach angle $\alpha_f$ in the illustrated staking ring embodiment is about 40 degrees. A shallower angle (e.g., of about 30 degrees) may be preferable in some cases, as may a longer spacing $w_f$ between protrusions to provide longer, lofted pillow regions.

Figure 10:
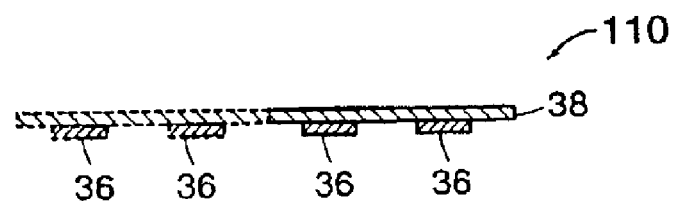
FIG. 10 illustrates a pre-formed electrical conductor product.
Figure 10A:
FIG. 10A illustrates pre-formed loop material for forming certain embodiments of electrical cables of the invention.
Figure 11A:
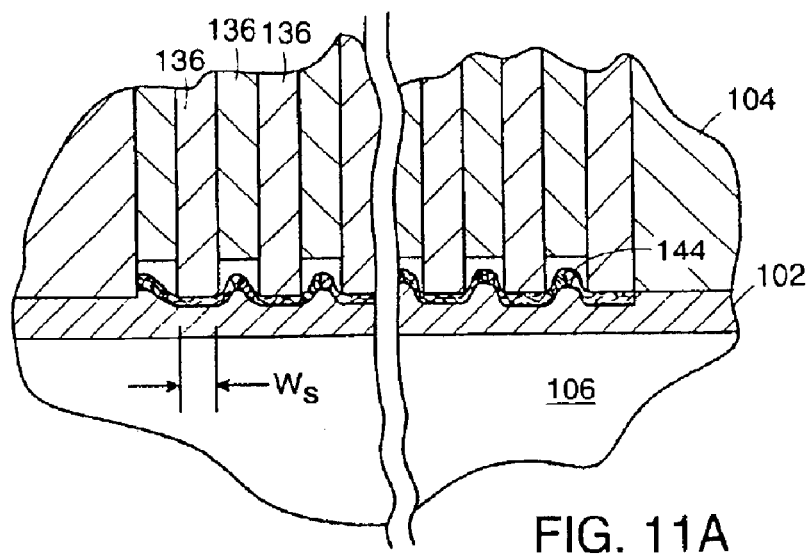
FIG. 11A is a view similar to that of FIG. 11, with a modified mold roll.

FIG. 11A shows a staking ring configuration for producing the bonding pattern shown in FIG. 8D (electrical conductor product 110 not shown). Staking rings 136 having the profile shown in FIG. 10 are stacked together with staggered protrusions, such that the pattern of heavily bonded regions resembles a checkerboard with elongated "pillows" extending outward between the heavily bonded regions. The width $w_s$ of each ring is about 0.018 inch.

In another embodiment, also illustrated in FIG. 9, excessive resin penetration of loop material 144 is avoided by providing a barrier layer 128 between the resin and the loop material. Barrier material 128 is, in some instances, a perforated paper or film that allows resin to pass into the loop material in selected regions but inhibits its flow into other regions, such as for producing the bonding pattern of the center region of loop material shown in FIG. 8E. The barrier material may also be a homogeneous sheet of material having a high porosity, equally limiting the penetration of resin into the loop material across the width of the barrier material. Rather than be introduced as a separate sheet, in some cases the barrier material is pre-applied to the surface of loop material 110 and may be in the form of a binder located in discrete areas of the loop material and locally encapsulating fibers of the loop material, for instance. In many cases, the barrier material is narrower than the loop material, and centered along the width of the loop material, to enable full penetration of resin into the edges of the loop material. In all cases in which the barrier material becomes permanently bonded to the substrate and therefore becomes an integral part of the final product, it should be selected for its low material cost and weight.

Figure 13:
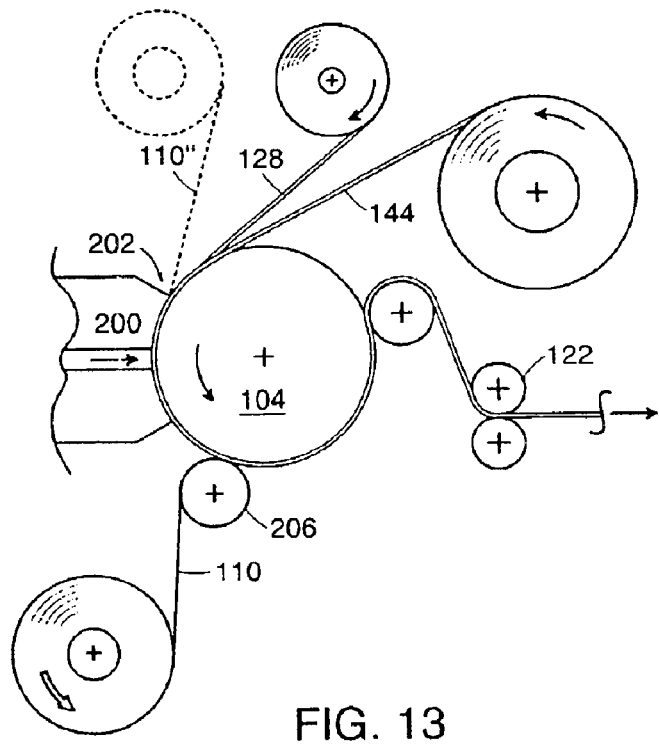
FIG. 13 illustrates a second method and apparatus for forming electrical cables with integral fasteners such as those illustrated in FIGS. 7 and 8.

FIG. 13 illustrates an alternative method and apparatus for forming the above-described electrical cables. The contoured surface of an extrusion head 200 (sometimes called an injection head) is placed adjacent a mold roll 104 (mold roll 104 once again lacking fastener protrusion shaped cavities to produce the loop bearing conductor cable of FIG. 8), and a continuous flow of molten resin is injected under pressure into the gap 202 defined between head 200 and mold roll 104, filling gap 202 and forming the front and back faces of the substrate. The configuration and construction of mold roll 104 is the same as is shown in FIG. 8, in which member 106 may be taken to be the adjoining extrusion head. To create the loop bearing electrical cable such as that illustrated in FIGS. 8–8E and described above using this method and apparatus the strip 144 of loop material is fed through a predetermined region of gap 202, and held up against the surface of mold roll 104 by resin pressure in the gap. In applications where it is not possible to fill gap 202 without completely saturating loop material 144 with resin, a strip of barrier material 128 may be fed through gap 202 between head 200 and loop material 110 to prevent resin penetration of the loop material along predetermined regions. Barrier material 128 is discussed in more detail above with respect to FIG. 9. Electrical conductor product 110 is laminated to the back face of the substrate while the molded product is retained on mold roll 104, by pressure supplied by pressure roll 206.

FIG. 13 also illustrates an alternative method and apparatus for producing the fastener protrusion bearing conductive cable illustrated in FIG. 7. In this embodiment loop material 144 and barrier material 128 are not present and mold roll 104 has fixed fastener element molding cavities as described above with respect to FIG. 9. Resin alone is fed through extrusion head 200 into gap 202 between extrusion head 200 and mold roll 104 where gap pressure forces the resin to fill the mold cavities as previously described. Electrical conductor product 110 is laminated to the back face of the substrate while the molded product is retained on mold roll 104, by pressure supplied by pressure roll 206 to produce an electrical cable strip bearing protruding fastener elements.

In an alternative method and apparatus illustrated in FIG. 13, electrical conductor product 110" (as indicated by dashed lines) is fed directly into gap 202. Electrical conductor product 110" consists of either bare or insulated strands of electrical conductor (as described below with reference to FIG. 14) or has a backing of at least sufficient porosity that resin introduced to gap 202 flows at least partially through or around the electrical conductor product to insulate the conductors and bond the materials to form an integral cable product.

Figure 14:
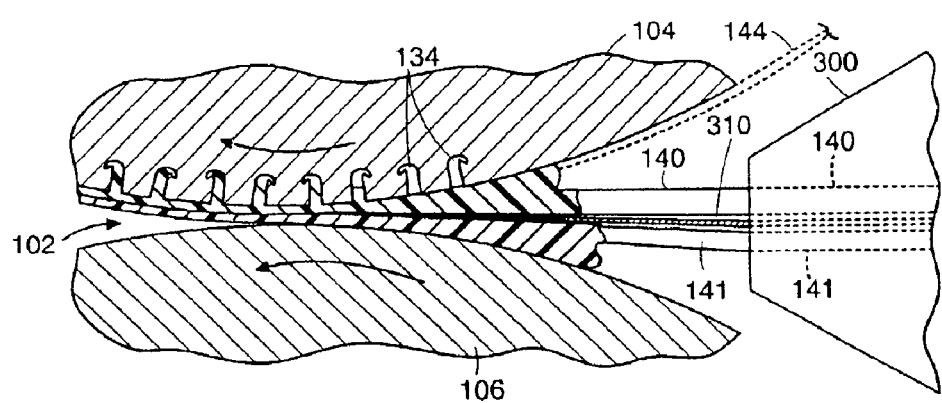
FIG. 14 illustrates a third method and apparatus for forming electrical cables with integral fasteners such as those illustrated in FIGS. 7 and 8.

FIG. 14 illustrates an additional method and apparatus for producing the above described electrical conductor cables. In this embodiment extruder head 300 supplies resin flows or films 140, 141 into nip 102 formed by mold roll 104 (the mold roll having fixed fastener element molding cavities 155 as described above with respect to FIG. 9 to produce a cable product such as that illustrated in FIG. 7) and pressure roll 106, respectively. The arrangement of nip 102 is as described above in reference to FIGS. 9 and 9A. Simultaneous with the resin feed, multiple strands of bare conductive material 310 are fed through an extrusion die of extruder head 300 into nip 102 between the separate resin flows or films 140, 141. Pressure and temperature conditions in nip 102 force resin flow or film 140 to flow into the molding cavities as described above, encapsulates conductive material 310 within resins 140, 141, and bonds separate resin flows or films 140, 141 to create an integral cable product having conductors insulated within a substrate and fastener protrusions extending from a surface of the substrate.

The method and apparatus illustrated in FIG. 14 are also capable of producing cable product such as that illustrated in FIG. 8 and described above. In such an arrangement mold roll 102 lacks fastener protrusion shaped cavities and loop material 144 (shown as dashed lines in FIG. 14) as described above in reference to FIG. 8 is fed directly on to the surface of mold roll 102 prior to the entrance of resin flow 140 into nip 102. As described above with reference to FIGS. 9 and 13, staking rings, barrier layers, or both may be used to control the areas and amounts of resin 140 penetration into loop material 144 to bond the materials.

The methods and apparatus of FIGS. 9, 13, and 14 are also capable of forming electrical cables having both fastener protrusions (e.g., hooks or mushrooms) and loop fastener material capable of engaging the protrusions to form a fastening. Using the above described techniques wherein mold roll 104 has fastener protrusion forming cavities and loop material 144 is fed into the nip or gap while resin and electrical conductor product are introduced yields a self-engageable electrical cable product having both types of fastener elements.

Figure 15:
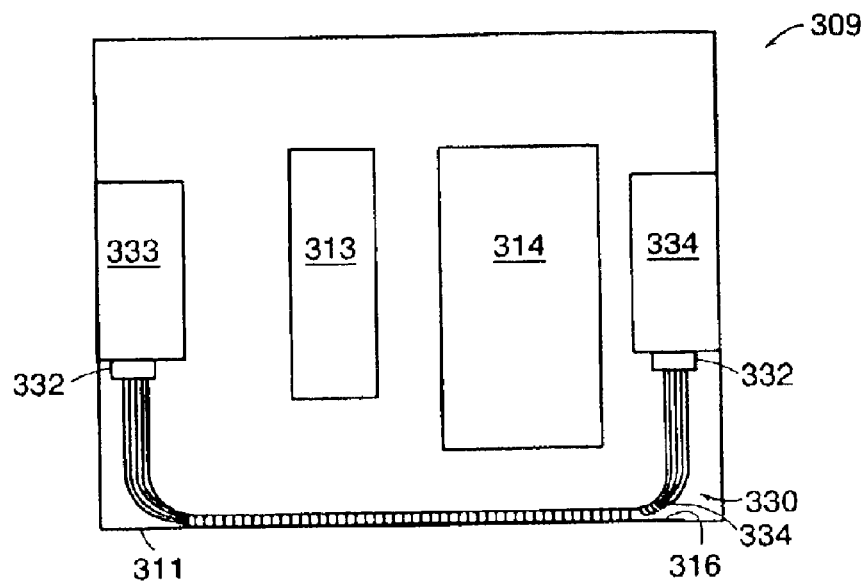
FIG. 15 illustrates an electrical device equipped with an electrical ribbon cable having integral fasteners.
Figure 16:
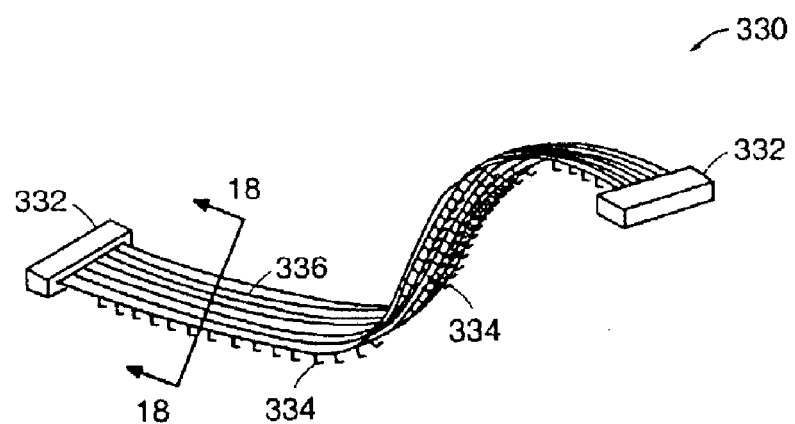
FIG. 16 illustrates the electrical ribbon cable assembly of FIG. 15.

As illustrated in FIG. 15, ribbon cable assembly 330 is secured within computer casing 309 with terminal ends 332 connected to internal components 333 and 334 to deliver power or electrical communications signals therebetween. Referring now also to FIG. 16, cable assembly 330 has a multiplicity of conductor strands 336 within an insulating substrate 338 which has fastener elements 334 similar to those described above with reference to FIG. 7 on its surface. Panel 311 of computer casing 309 has mating fastener elements, e.g., loops 316, such as those described above with reference to FIGS. 2 and 3. During assembly of the computer, terminals 332 are first connected to internal components 333, 334 respectively. The fastener elements 334 of cable assembly 330 are then adjustably and releasably engaged with mating fastener elements, e.g., loops 316, on panel 309. This allows for easier entry or removal of additional computer components, e.g., boards 313, 314, within computer casing 309, and keep the cable layout within the cabinet organized.

Figure 17:
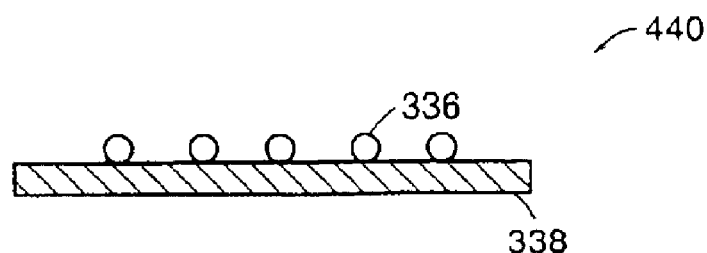
FIG. 17 illustrates a pre-formed electrical conductor product used in the formation of the electrical ribbon cable of FIG. 16.

Any of the methods and apparatus described above with, e.g., reference to FIGS. 9, 13, and 14 can be used to create a continuous strand of ribbon cable for use in ribbon cable assemblies (e.g., assembly 330) with attached fastener elements, e.g., hooks 334 or loops (not shown). In one example illustrated in FIG. 17 preformed electrical conductor product 410 is provided having multiple conductive wires 336 attached to insulating tape 338. Wires 336 can be of circular, or flattened rectangular or other flattened cross-section, of stranded construction, or can be strips of conductive material deposited or otherwise disposed on insulating tape 338. In one embodiment, the conductors 336 are strips deposited on backing tape 338 to form a circuit or other conductive path. For example, any of the strip-form products described herein (particularly, but not exclusively, the products illustrated in FIGS. 40 and 41) can be fed through a hook forming nip (as described above) to form a layer of hook-bearing thermoplastic resin either as an electrical insulation layer immediately adjacent the conductors, or as a layer joined integrally to a pre-existing electrical insulation layer. For example, flexible cable containing circuitry, such as embedded surface-mount components or other electronic devices, can be fed directly through the nip to form hooks on one side of the circuit cable. In another embodiment, the backing tape 336 is, itself, a pre-formed hook tape (similar to layer 140), the conductors 336 being disposed on a surface of the hook tape opposite the hooks.

Figure 18:
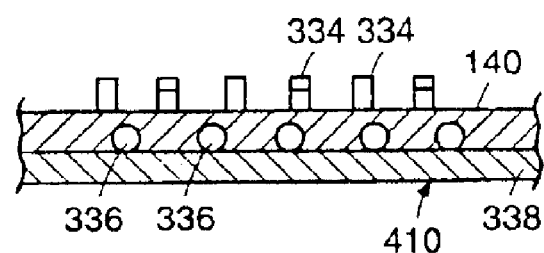
FIG. 18 is a cross-sectional view of the electrical ribbon cable, taken along line 18—18 of FIG. 16.

Conductor product 410 along with plastic resin 140 is fed through a nip or gap to form a cable wherein the resin forms molded fastener elements 334 and attaches to insulator tape 338 thereby insulating multiple conductive wires 336 and producing the integral fastener-cable of FIG. 18. Alternatively, loop material 144 (not shown) and resin are simultaneously fed into the nip of one of the above described apparatus (wherein the mold roll does not have fastener forming cavities) such that the resin bonds to the insulator tape 338 to insulate multiple conductive wires 336 and at least partially penetrates loop material 144 to form the continuous strand of conductive cable (as described above with reference to FIGS. 9, 13).

Figure 18A:
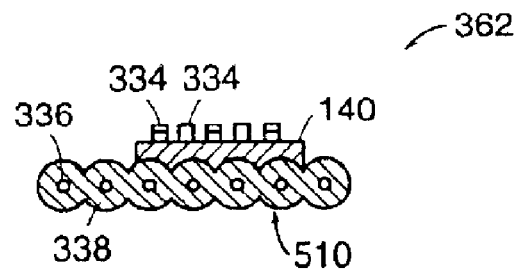
FIG. 18A is a cross-sectional view similar to that of FIG. 18, illustrating a variation of the electrical ribbon cable structure.

In another example illustrated in FIG. 18A, pre-formed ribbon cable 510 has multiple conductors 336, fully insulated by insulator material 338. Pre-formed ribbon cable 510 is fed into nip 102 (FIGS. 9, 13, 14), as element 110 or 310, respectively, and fastener elements (fastener protrusions 334 or loop material, not shown) are bonded to at least a portion of a surface of ribbon cable 510. In this manner, a fully pre-formed ribbon cable can be modified to have attached fastener elements molded thereon for use in assembly of electronic products.

Figure 19:
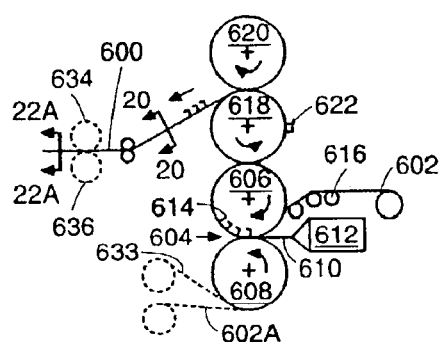
FIG. 19 is schematic illustration of various methods for producing elongated electrical cables of the invention.

Referring now to FIG. 19, continuous electrical cable 600 is manufactured by feeding multiple electrically conductive wires 602 into nip 604 formed by rotating mold roll 606 and counter-rotating pressure roll 608. Wires 602 are bare, i.e., without an insulating coating and are laterally spaced apart from one another as they enter nip 604. In order to control the lateral position of the wires as they enter the nip, guide rollers 616 are provided with individual grooves, one for each wire introduced, to prevent the wires from wandering laterally as they approach the nip. Furthermore, pressure roll 608 has corresponding grooves that aid in aligning wires 602 during the encapsulation process now to be described.

Simultaneously with wires 602, a band 610 of molten thermoplastic resin is introduced to nip 604 from extruder head 612. Pressure and temperature conditions in the nip cause the molten resin to envelop the wires and also cause a portion of the resin to fill hook shaped cavities 614 provided in mold roll 606. As the cooled mold roll continues to rotate, the resin and encapsulated wires remain adjacent the periphery of the mold roll until take-off rollers 618 and 620 act to strip the product 600 from the mold roll, thus extracting the now solidified hooks 622 from their respective cavities 614.

Figure 20:
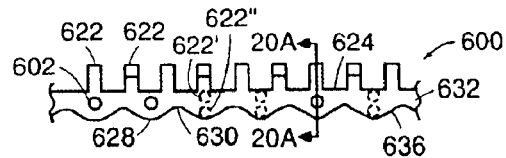
FIG. 20 is an unsealed, diagrammatic, cross-sectional view taken along line 20—20 of FIG. 19.
Figure 20A:
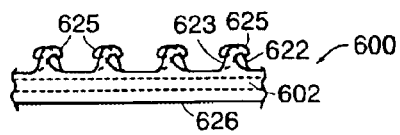
FIG. 20A is an unsealed, diagrammatic, cross-sectional view taken along line 20A—20A of FIG. 20.

Referring now to FIGS. 20 and 20A, product 600 has an electrically insulating body 632 of thermoplastic resin with an upper surface 624 and a lower surface 626. Loop-engageable hooks 622 extend from upper surface 624, each hook being an integral extension of the thermoplastic resin of the insulating body. Hooks 622 have a stem portion 623 and a loop-engageable head portion 625 that extends outward from the stem to overhang upper surface 624. Bottom surface 626 has peaks 628 corresponding to the wire guiding grooves in pressure roll 608 with a valley 630 of reduced thickness separating adjacent peaks 628. Each conductive wire 602 is encapsulated within a peak 628 and separated from an adjacent conductive wire by insulating thermoplastic resin body 632. In one example, resin body 632 is of a flexible PVC material. The position of wires 602 relative to upper surface 624 and lower surface 626 is dictated by the relative positions of the wire and the molten thermoplastic resin as they enter the nip and the flow dynamics of the molten thermoplastic resin within the nip. As illustrated in FIG. 19, by introducing the wires 602 above the extruder head 612 the tendency is for the wires to be relatively nearer upper surface 624 of final product 600 (as indicated by wires 602' shown as dashed lines in FIG. 20). Conversely, if wires are fed from below the extruder head (as indicated by wire feed 602A illustrated in dashed lines in FIG. 19) the tendency is for the wires to be relatively nearer lower surface 626 in final product 600 (as indicated by wires 602" shown as dashed lines in FIG. 20).

One alternative for controlling the vertical position of wires 602 within insulating body 632 is to provide a supporting substrate 633 beneath the wires as the molding process takes place. As illustrated in FIG. 19, substrate 633 (shown as dashed lines) is fed onto the grooved pressure roll 608 so that it sits on the peaks of the grooves of the roll. Substrate 633 can be any material that is conducive to supporting the wires while also allowing the molten thermoplastic resin to flow through and encapsulate the substrate during the molding process. In one example, substrate 633 is a mat of nonwoven fibers. The wires 602A are then fed onto the substrate at positions corresponding to the guiding grooves of pressure roll 608. The somewhat resilient substrate 633 allows wires 602A to enter only partially into their respective guiding grooves of pressure roll 608, thus allowing the lateral position of the wires to be controlled while preventing the wires from reaching the bottom of the grooves. Upon entering the nip, molten resin 610 flows upward to fill cavities 614 and downward through substrate 633 to fill the grooves of pressure roll 608, meanwhile the substrate prevents wires 602A from sinking into contact with pressure roll 608.

Figure 21:
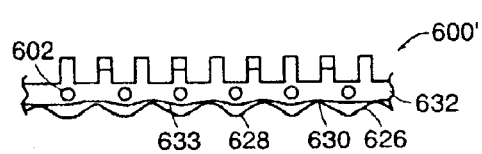
FIG. 21 is a view similar to that of FIG. 20 illustrating an alternative elongated electrical cable.

The resulting product 600' (FIG. 21) has the supporting substrate 633 embedded beneath the wires 602 within the insulating body 632.

Figure 22:
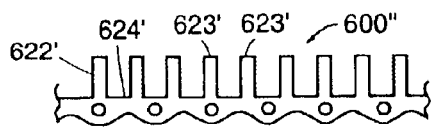
FIG. 22 is a view similar to that of FIG. 20 illustrating an intermediate product to be subsequently formed into an alternative electrical cable of the present invention.
Figure 22A:
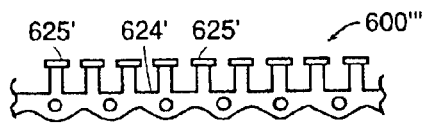
FIG. 22A is an unsealed, diagrammatic, cross-sectional view taken along line 22A—22A of FIG. 19.

In an alternative embodiment, also illustrated in FIG. 20 and further referring to FIGS. 22 and 22A, mold cavities 612 are of a shape protruding straight inwardly from the periphery of mold roll 606 toward its center, i.e., cavities 612 are shaped to form stems only and do not have an undercut portion for forming an engaging head of a fastener element. The rest of the cable forming method proceeds as described above except the product 600" (FIG. 22) stripped from the mold roll has only integrally molded stems 622' protruding from its upper surface 624'. Subsequent to the stripping operation, the cable 600" is passed between a heated roller 634 and an anvil roller 636 (shown in dashed lines) to produce a final product 600''' (FIG. 22A). Rollers 634, 636 are arranged so that heated roller 634 contacts and deforms the tip portion 623' of each stem 622' to form a loop-engageable head portion 625' that overhangs upper surface 624'.

Figure 23:
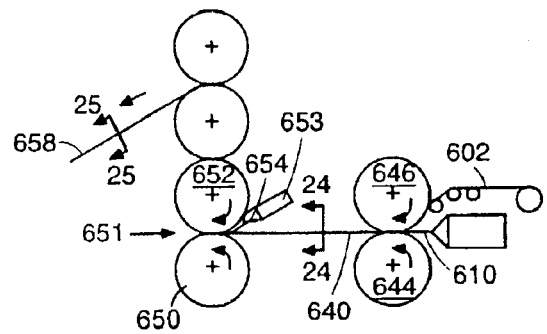
FIG. 23 is a schematic illustration of an alternative method for manufacturing an electrical cable of the present invention.
Figure 24:
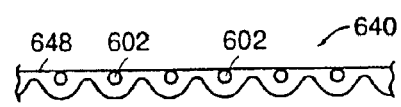
FIG. 24 is an unscaled, diagrammatic, cross-sectional view taken along line 24—24 of FIG. 23.
Figure 25:
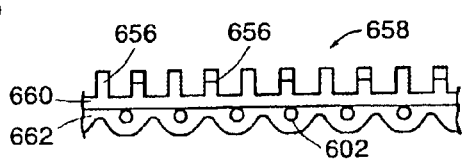
FIG. 25 is an unscaled, diagrammatic, cross-sectional view taken along line 25—25 of FIG. 23.

Referring now to FIGS. 23–25, another technique for avoiding any potential problems of centering and/or fully encapsulating the wires within the insulating body is to form the insulating body in a two step process. Initially, an intermediate product 640 (FIG. 23) is formed by feeding wires 602 and band 610 of thermoplastic resin into a nip formed by two pressure rolls 644 and 646. Similar to the pressure roll 608 described above with reference to FIG. 20, lower pressure roll 646 has peak and valley forming grooves on its surface to aid in guiding the wires laterally, however, in this two step process, upper pressure roll 644 has a flat peripheral surface which forms the flat upper surface 648 (FIG. 24) of intermediate product 640. Intermediate product 640 is then fed into a second nip 651 formed by a grooved lower pressure roll 650 and a mold roll 652 having hook cavities as described above. Simultaneously with intermediate product 640, a band of thermoplastic resin 654 is introduced from extruder head 653 to the nip directly adjacent the periphery of the mold roll 652 and hooks 656 (FIG. 25) are formed in a manner similar to that described above with reference to FIG. 20. The resulting final product 658 has a multi-layered structure including an upper, hook bearing layer 660 permanently bonded during the hook molding operation to a lower layer 662 that was initially formed as intermediate product 640. Wires 602 are either fully encapsulated by lower layer 662 or are fully encapsulated by being sandwiched between the upper and lower layers 660, 662, respectively.

Figure 26:
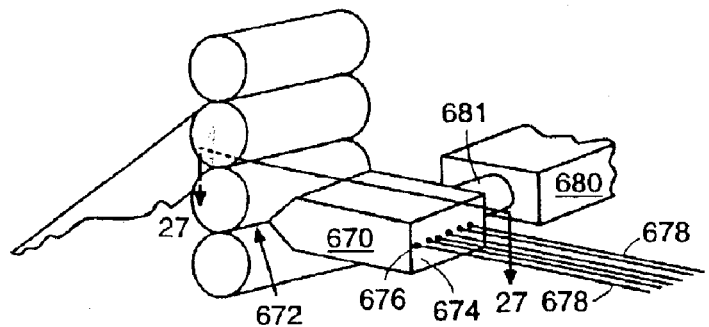
FIG. 26 is a schematic, perspective view of an alternative method for making an electrical cable of the present invention.
Figure 27:
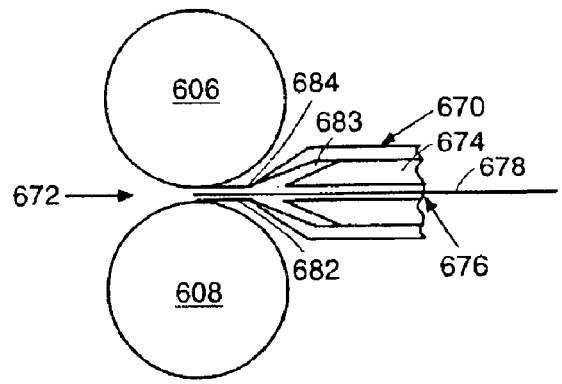
FIG. 27 is an unscaled, diagrammatic, cross-sectional view taken along line 27—27 of FIG. 26.

Referring now to FIGS. 26 and 27, in yet another method for forming a continuous cable with integrally molded fastener element stems extending from a surface of a conductor insulating body, a die 670 is positioned just upstream of nip 672. Die 670 includes a wire guide plate 674 defining individual guide sleeves 676 each of which receives and guides a conductive wire 678. Guide sleeves 676 can be cylindrically shaped for receiving wires of round cross-section or can be of rectangular cross-section for receiving flattened conductors to produce relatively flat cables. Arranged perpendicular to the feed direction of the wires is an extruder 680 which introduces molten thermoplastic resin through nozzle 681 to an internal resin flow path 683 defined by die 670. Flow path 680 directs the molten resin to flow above, below and between the plurality of wires 678 before the combination 682 of wires and molten resin is forced through slot 684 and into the immediately adjacent nip 672. Once the material is in nip 672, the molding process proceeds as described above with reference to FIG. 20 with no further need for lateral or vertical wire guiding and/or alignment.

Figure 28:
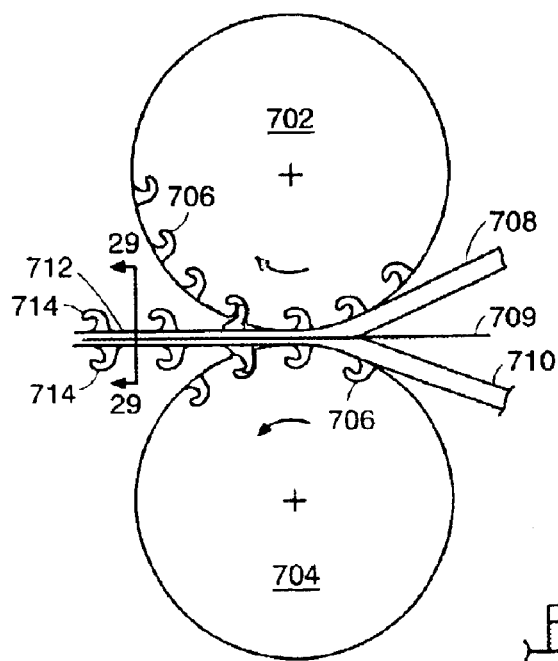
FIG. 28 is a schematic illustration of a portion of a method for manufacturing an alternative electrical cable of the present invention.
Figure 29:
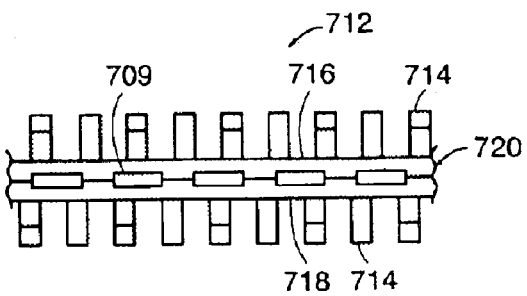
FIG. 29 is an unscaled, diagrammatic, cross-sectional view taken along line 29—29 of FIG. 28.

In one particular embodiment, illustrated in FIGS. 28 and 29, the wires and thermoplastic resin are fed through a nip 700 formed by two mold rolls 702, 704, rotating in opposite directions. Each mold roll 702, 704 defines an array of hook (or stem) forming cavities 706, similar to those described above. In the embodiment shown, two streams 708, 710 of molten thermoplastic resin are fed into nip 700 while a plurality of laterally spaced apart conductive wires 709, in the form of flat conductive strips, as illustrated, are introduced to nip 700 between streams 708, 710. Alternatively, streams 708, 710 are initially two solidified thermoplastic resin films. The temperature and pressure conditions in the nip force the thermoplastic resin (whether initially molten or solid) to at least partially fill the cavities so that the solidified product 712 stripped from the exit side of the nip has loop-engageable fastener elements 714 (or stems that can be later post-formed as described above) protruding from opposite broad surfaces 716, 718 of the electrically insulating body 720 of thermoplastic resin.

Yet another method for producing electrical cables of the present invention is illustrated in FIGS. 30–33. The method is a lamination process in which a pre-formed hook tape 730, spaced apart electrical conductors 732 and a backing tape 734 are simultaneously fed between two bonding rollers 736, 738. Pre-formed hook tape 730 is of an electrically insulating thermoplastic resin, one example being a polyester material, hook tape 730 having a base 740 defining first and second surfaces 742, 744, respectively. Hooks 746 are protrusions of the thermoplastic resin of first surface 742 and are suitable for engaging a loop material. Hook tape 730 is fed between pressure rolls 736 and 738 with its hook-bearing first surface 742 immediately adjacent the peripheral surface of the first pressure roll 736. Backing tape 734, also of an electrically insulative material (but not necessarily of the same material as hook tape 730), defines a first surface 748 and a second surface 750 and is fed between rolls 736 and 738 with its first surface 748 immediately adjacent the peripheral surface of pressure roll 738.

Simultaneously with hook tape 730 and backing tape 734, a plurality of flat conductive strips (or wires of circular cross-section) is introduced between pressure rolls 736, 738 in laterally spaced apart fashion. Conductors 732 are positioned between second surface 744 of hook tape 730 and second surface 750 of backing tape 734. Pressure roll 736 has a series of protruding rings 752 arranged to contact first surface 742 of hook tape 732 only along regions 753 of the forming laminate 754 that lie between the spaced-apart conductors 732. Rolls 736 and 738 are heated and positioned to create pressure in the regions 753 corresponding to each ring 752 such that thermal bonding occurs along the contacted regions of laminate 754. The thermal bonding lines act to permanently weld hook tape 730 to backing tape 734 in a manner that electrically isolates conductors 732 from one another and insulates the conductors between the hook tape and the backing tape. Pre-formed hook tape 734 can be provided with regions 753 distinguished by flat areas (as illustrated in FIG. 31) on first surface 742, i.e., areas lacking rows of hooks 746. Alternatively, first surface 742 of pre-formed hook tape can have a uniform array of hooks 746 across its surface, the hooks in regions 753 subsequently coming into contact with rings 753 whereby the hooks are melted and or crushed by the applied pressure and heat. Either way, the hooks remaining on surface 742, i.e., those positioned between rings 752 during the lamination process, are sufficient to provide the necessary fastening capability with mating loop materials.

In another alternative, pressure roll 736 acts as an anvil (rotary or stationary) while pressure roll 734 is ultrasonically vibrated at a frequency which causes hook tape 730 to be welded to backing tape 734 along the regions 753 where rings 752 contact hook tape 730.

Referring again to FIG. 30 and now also to FIG. 34, electrical cable 800 is made by yet another laminating method. Hook tape 730 (as described above with reference to FIGS. 30 and 31) is provided with a layer of electrically insulating adhesive 770 (shown as dashed lines in FIG. 30) applied to its second surface 744 as it is fed between smooth pressure rolls 760 and 762. Similarly, backing tape 734 is provided with a layer of adhesive 771 (dashed lines) applied to its second surface 750 as it is fed between rolls 736, 738. However, unlike the methods discussed above, in this particular example rolls 736 and 738 both have a smoother outer surface, i.e., neither roll has the pressure rings 752 discussed above with reference to FIG. 33. Conductors 732 are introduced between the rolls so as to be sandwiched between the hook tape and the backing tape. The smooth pressure rolls are arranged to cause the adhesive 770 on second surface 744 of hook tape 730 and the adhesive 771 on second surface 750 of backing tape 734 to contact one another, thereby bonding the two tapes together. The adhesive also contacts the conductors 732, at least partially encompassing them and acting in combination with the hook tape and/or the backing tape to envelop and electrically isolate the conductors from one another. It is also possible to eliminate one of the adhesive layers 771, 772, the remaining adhesive layer being sufficient to bond hook tape 730 to backing layer 734 while enveloping and electrically isolating conductors 734 between the layers.

In yet another alternative, the backing tape 734 is in the form of a second strip of hook tape, similar or identical to the hook tape 730 described above, so that the resulting electrically conductive cable has loop engageable hooks extending from opposite exposed surfaces.

It should be noted that in the adhesive laminating examples just discussed, the hooks 746 are not permanently deformed to any significant extent by their passage through the smooth pressure rollers. Rather the hooks are resilient enough to withstand the pressures applied by the unheated rolls.

Figure 35:
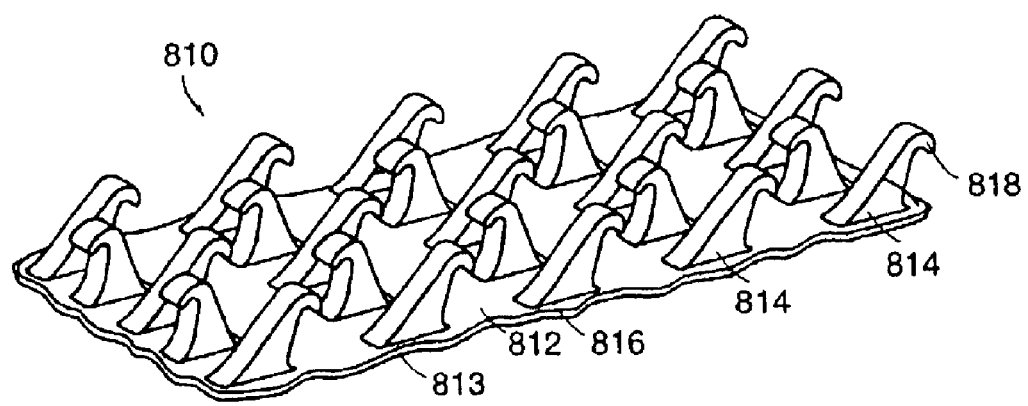
FIG. 35 is a magnified view of a portion of a hook fastener tape suitable for use in the present invention.

As illustrated in FIG. 35, hook fastener tape 810 has hook fastener elements 814 extending from a first 812 of two, opposite broad surfaces 812, 813 of base 816. While the illustrated hook fastener elements 814 of FIG. 35 are truly hook-shaped, the phrase "hook fastener elements", as used herein, refers generically to protrusions having tips shaped for engagement with a complementary loop material or, alternatively, with other like or unlike complementary protrusions. Each hook fastener element 814 has an engaging head 818 capable of releasably engaging a mating fastener material, e.g., loop material. Examples of other appropriate hook fastener element shapes include, but are not limited to stems having mushroom-, flat-headed disc- and palm tree-shaped heads.

Again, as discussed above with reference to FIG. 5, an example of a commercially available hook fastener tape suitable for use in the invention is the hook product designated CFM-29 available from Velcro USA, Corp. of Manchester N.H. The CFM-29 hook product has hooks of 0.015 inch (0.38 mm) height, a base thickness of 0.003 inch and a hook fastener element density of the order of 1000 or more hook fasteners per square inch.

Fastener tape 810 can be advantageously produced continuously and integrally of thermoplastic resin as described above, again with reference to U.S. Pat. No. 4,794,028, issued Dec. 27, 1988, to Fischer. Briefly, as illustrated, the right-hand portion of 1004 in FIG. 2, the Fischer process employs a nip formed between a mold roll 1006 and a pressure roll 1008. Molten thermoplastic resin 1000 is fed into nip 1004 while the mold and pressure rolls rotate in opposite directions, as indicated by the arrows in FIG. 36. Pressure in the nip forces extruded resin, to fill a plurality of hook-fastener-shaped cavities (1010) provided in mold roll 1006. Resin in excess of cavity volume takes the shape of the nip to form the base substrate, e.g., (base 816 of FIG. 35). Subsequently, the resin solidifies and is stripped from the mold roll to produce continuous fastener tape 810.

Other techniques for continuously and integrally forming a thermoplastic hook fastener tape are equally suitable for use with the present invention. One such technique involves the extrusion of thermoplastic resin into a gap formed between the extrusion head and the mold roll without the use of a separate pressure roll. This technique is more fully described, for example, in U.S. Pat. No. 5,441,687, issued Aug. 15, 1999, to Murasaki et. al, to which the reader is referred for further information.

In another suitable technique, stems rather than hook fastener element shaped projections are initially formed integrally with a thermoplastic base. Subsequently, the tops of the stems are shaped to form engaging heads by, e.g., contacting the stem tips with a heated roller or heating the stem tips contacting them with an unheated or cooled roller, to produce stems having heads capable of engaging complementary loops or like or unlike shaped hook fastener elements. Examples of these techniques are more fully illustrated in U.S. Pat. No. 5,077,870 issued Jan. 7, 1992 to Melbye et al. and U.S. Ser. No. 09/231,124, filed Jan. 15, 1999, respectively. The reader is referred to both of these references for further information.

In yet another suitable technique, a thermoplastic base is extruded having continuous rails of hook fastener-shaped profile. The rails, but not the base, are subsequently slit laterally at intervals along the length of the extrusion to form separate portions of the fastener-shaped rail, each portion separated from an adjacent portion by a slit. The base is then permanently stretched longitudinally to create space between adjacent portions of the fastener-shaped rails. The resulting fastener tape has rows of spaced individual hook fastener elements. Such a technique is more fully described for example, in U.S. Pat. No. 4,894,060, issued Jan. 16, 1990, to Nestegard, to which the reader is referred for further information.

Figure 35A:
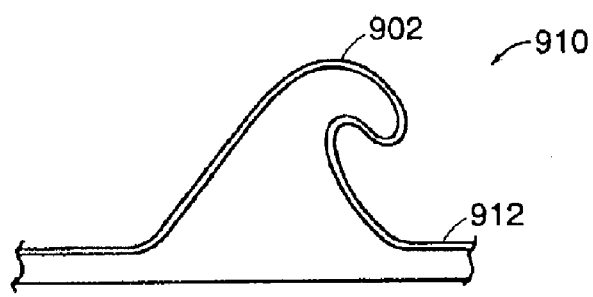
FIG. 35A illustrates a further magnified side view of a single hook fastener element of the hook fastener tape of FIG. 35 having a layer of conductive coating.

As illustrated in FIG. 35A, fastener tape 910 has a relatively thin layer 902 of electrically conductive material disposed on its hook fastener element-bearing surface 912. The electrically conductive material forms a layer of roughly uniform thickness that follows closely the contour of fastener tape 910. Preferably, the coating material is highly conductive, e.g., silver, the thin layer of the material offering low resistance to the transmission of electrical signals along the fastener tape. Also, it is preferable that the conductive coating 902 be attached to the fastener tape 910 in a manner that allows the fastener tape to remain flexible. Where the conductive coating encompasses hook fastener elements, it is important that the conductive coating allow the hook fastener elements to flex as necessary to engage and disengage complementary loop or other hook fastener elements while remaining integral with the fastener tape.

Referring again to FIG. 36, a technique for applying an electrically conductive layer 902 to fastener tape 910 to produce a conductive hook tape having the preferred properties previously described is illustrated. The method includes a reduction process in which the conductive material reacts with a previously applied sensitizer to attach the conductive material to fastener tape 910. In one example, referred to herein as "silvering" and now to be described, the sensitizer comprises tin and the electrically conductive material comprises silver. The silvering process is a chemical reaction that results when a solution of silver salt comes in contact with a reducer. The silver deposits where the surface has been treated with a sensitizer which coats the surface with a thin layer, e.g., a thickness of the order of the molecular size of the sensitizer compound, of tin on which the silver attaches.

Figure 36:
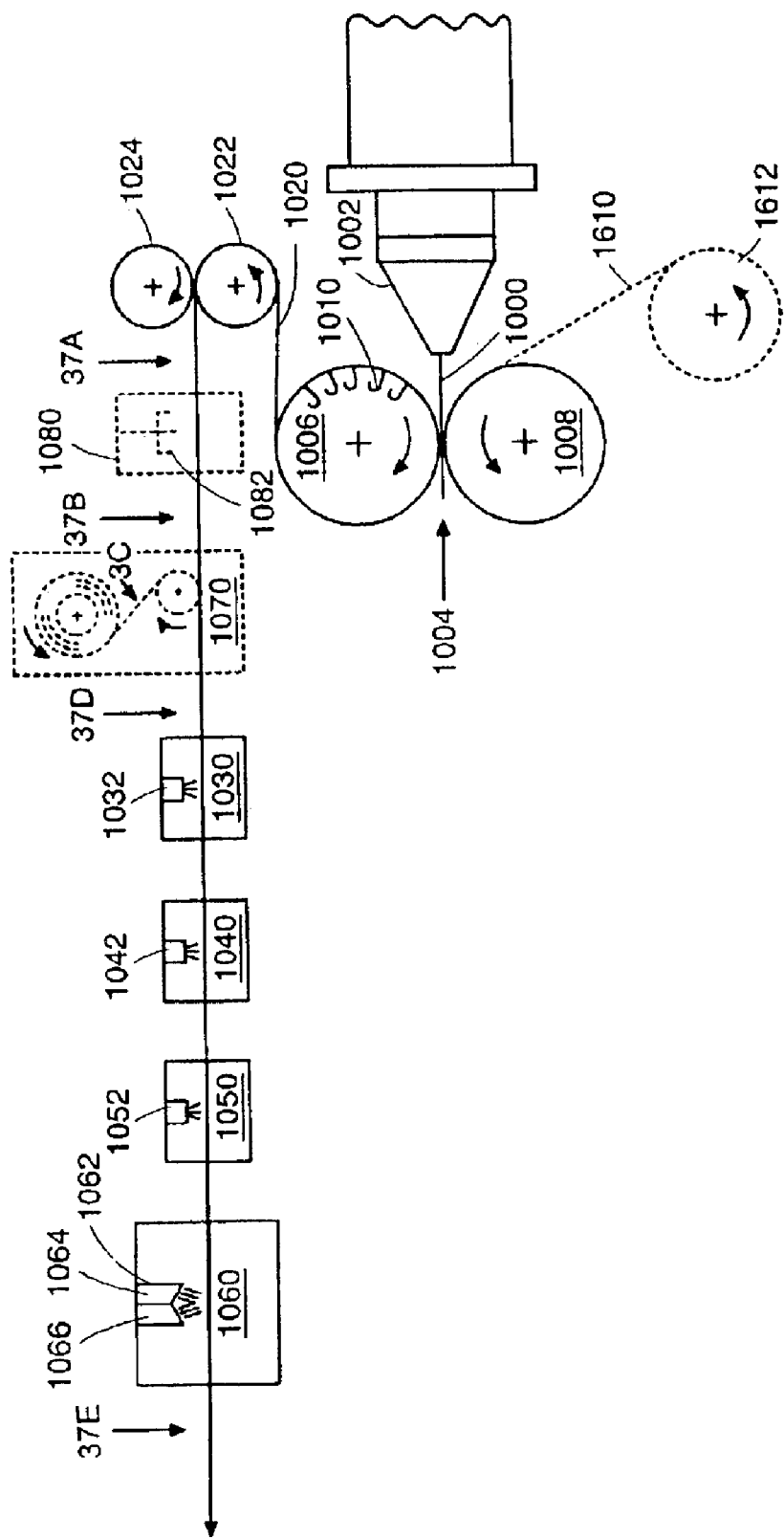
FIG. 36 illustrates schematically a method and apparatus for producing the hook type of FIG. 35 and a method and apparatus for applying a conductive coating to selected areas of the fastener tape.

As illustrated in FIG. 36, molten resin 1000 is extruded from extruder head 1002 into a nip 1004 formed between a mold roll 1006 and a pressure roll 1008. Mold roll 1006 has a plurality of hook-shaped cavities 1010 formed to extend inwardly from its nip-forming surface. Pressure created in the nip forces molten resin 1000 to enter cavities 1010 while excess resin remains in the nip between the mold and pressure rolls. As the rolls rotate (in the direction indicated by the respective arrows) the resin remains associated with the mold roll as it cools and begins to solidify. The resin in the cavities forms hook fastener elements (e.g., hook fastener elements 814 of FIG. 35) and the resin that remains associated with the peripheral surface of mold roll 1006 forms a base (e.g., base 816 of FIG. 35) from which the hook fastener elements extend. The resulting fastener tape 1020 is stripped from mold roll 1006 by stripping rolls 1022 and 1024 is then passed on to the "silvering" stage where the conductive material is applied.

In some cases, in order to prepare the surface to be conductively coated, a wetting agent is first applied at station 1030. In one example the thermoplastic resin of the fastener tape is polypropylene, and the wetting agent is a product known as C22 and available from Peacock Laboratories Inc., of Philadelphia, Pa. The C22 is mixed with water (preferably deionized) in a ratio of 14 ml. to 16 oz., respectively, and is then sprayed, as illustrated by sprayer 1032, dipped, or wiped onto the desired area of the hook fastener product.

With the wetting agent applied, the hook fastener product is then passed on to station 1040 where a sensitizing solution is applied. Again using the example of a polypropylene thermoplastic resin, one appropriate sensitizing solution is No. 93 Sensitizing Solution available from Peacock Laboratories Inc., of Philadelphia, Pa. The No. 93 Sensitizing Solution is mixed with water (preferably deionized) in a ratio of 14 ml. to 16 oz., respectively, and is then sprayed, as illustrated by sprayer 1042, dipped, or wiped onto the desired area of the hook fastener product.

After allowing the sensitizing solution to cure on the hook fastener product, e.g., approximately 60 seconds in the case of No. 93 Sensitizing Solution on polypropylene, the hook fastener product is directed to station 1050 where the treated areas are rinsed with water (preferably deionized). Rinsing is effectively accomplished by spraying, as illustrated by sprayer 1052, dipping, or wiping the desired area with the rinse water.

The hook fastener product is then directed to station 1060 where it is saturated with a silvering solution to apply the electrically conductive coating. In the case of a hook fastener product of polypropylene, an appropriate silvering solution is HE-300 available from Peacock Laboratories Inc., of Philadelphia, Pa. The HE-300 silvering solution is made up of three constituent solutions including HE-300 Silver Solution "A", HE-300 Activator Solution "B" and HE-300 Reducer solution "C". All three components of the silvering solution are applied simultaneously by a dual-nozzle spray gun 1062. A first nozzle 1064 of spray gun 1062 is supplied from a tank containing the following mixture: Equal amounts of HE-300 Silver Solution "A" and HE-300 Activator Solution "B" each mixed with water (preferably deionized) in a ratio of 14 ml. to 8 oz., respectively. To avoid a potentially explosive reaction in the mixing tank, it is preferable to mix each of the concentrated HE-300 "A" and "B" solutions with the water, as opposed to mixing the concentrated solutions directly together.

Simultaneously, with the spraying from the first nozzle 1024, second nozzle 1066 sprays a solution supplied from a supply tank in which HE-300 Silver Reducer has been mixed with water (preferably deionized) in a ratio of 14 ml. to 16 oz.

The dual nozzle spray gun 1062 operates to simultaneously spray equal amounts of the mixtures from both spray nozzles 1064, 1066. As illustrated, nozzles 1064 and 1066 are biased toward each other so that their respective outputs mix at approximately their point of contact with hook fastener product. The result is that the separate streams combine approximately as the streams contact the surface of the hook fastener product. The area to be coated is saturated with the spray from dual nozzle spray gun 1062 until the surface changes to a gray/gold color. At this point, the conductive coating is sufficiently complete.

In another embodiment, the formed hook fastener product is covered by a masking material prior to the silvering process. As illustrated in FIG. 2, optional masking station 1070 (indicated by dashed lines) can provide a film that blocks the subsequent coatings applied at stations 1030, 1040, 1050 and 1060. When the film is patterned so as to allow passage of the subsequent coatings in only selected areas, the result is a hook fastener product that has a layer of conductive material applied to only an area corresponding to the pattern. The masking film can be subsequently removed leaving a conductive pattern disposed on an otherwise non-conductive surface.

In yet another embodiment, a piercing station 1080 is provided in which the formed hook fastener tape is pierced, e.g., by stakes 1082, to form through-holes that extend from a first to a second broad surface of the fastener tape base. Subsequent silvering of the hook fastener tape coats the surfaces defining the through-holes with conductive material. These conductive through-hole surfaces provide passageways for electrical signals to be passed from a first to a second surface of the hook fastener tape.

In one example, illustrated in FIGS. 37A–37E, formed book tape 1100 (FIG. 37A) is initially provided as a continuous sheet of thermoplastic resin 1102 having opposite, first and second broad surfaces 1101, 1103 with an array of integrally formed hook fastener elements 1104 extending from first broad surface 1101. As illustrated in FIG. 37B, hook tape 1100 is pierced to provide through-holes 1112 at various predetermined locations along the tape. Subsequently, a masking film 1120 (FIG. 37C) having a pattern of openings 1122 formed on an otherwise solid surface 1124 is applied (FIG. 37D) to the pierced hook tape. The location and frequency of the piercing that forms the through-holes of pierced hook tape 1100 and the pattern of openings 1122 on masking film 1120 are selected so that the application of masking film 1120 to pierced hook tape 1110 results in masked hook tape 1130 (FIG. 37D) having at least one through-hole 1112 disposed within at least one opening 1122, and in some embodiments, within each opening 1122. Masked hook tape 1130 is then coated with the conductive material, e.g., as described above, and the mask is removed to produce a selectively conductive hook fastener product 1140 having selected regions that are electrically conductive. The conductive areas 1142 correspond to the openings 1122 of masking film 1120 and each conductive area 1142 has at least one through-hole 1112, the defining surfaces 1144 of which are also conductively coated. The coated through-hole surfaces provide for the transmission of electrical signals from the hook fastener element bearing side of the hook tape to the opposite side.

Figure 38A:
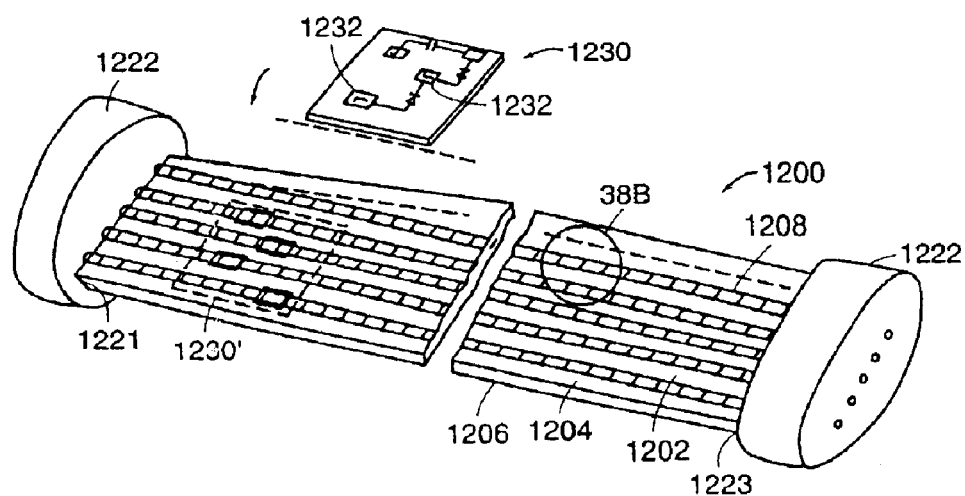
FIG. 38A illustrates a flexible, electrically conductive, hook fastener cable and a detachable corresponding electrical component.
Figure 38B:
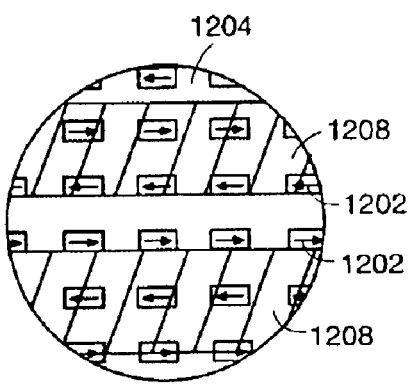
FIG. 38B is a magnified view of circle 38B of FIG. 38A.

The process described above with reference to FIGS. 36 and 37A–37E, can be advantageously employed to produce a wide variety of electrically conductive fastener products. In one example, a hook fastener cable 1200, extending between opposite longitudinal ends 1221 and 1223, as illustrated in FIGS. 38A and 38B is produced. The cable is formed of a substrate 1201 having two broad, opposite surfaces 1204, 1206 with hook fastener elements 1202 extending from broad surface 1204. Hook fastener elements 1202 and broad surface 1204 can be formed integrally from a thermoplastic resin, e.g., polypropylene, employing the process described above with reference to FIG. 36. Continuous conductive bands 1208 are applied to surface 1204 and extend along the length of the cable. The bands are separated from each other, e.g., by applying appropriate masking film strips to cable surface 1202 similar to the process described above with respect to FIG. 36. Such a cable can be produced in continuous length and subsequently cut to a desired length for its intended use.

Cable 1200 has electrical connectors 1222 at its terminal longitudinal ends. Conductive bands 1208 allow for passage of electrical signals between the two terminal connectors 1222 while hook fastener elements 1206 allow the cable to be releasably secured to a surface (not shown) equipped with complementary fastening material, e.g., a loop material. Also, as illustrated in FIG. 38A, an electrical signal processing component 1230, e.g., a microchip or circuit board having filters, diodes, etc., is equipped with one or more patches of a complementary fastening material 1232 releasably engageable by hook fastening elements 1202. Electrical component 1230 can be releasably fastened at a selected position along the length of cable 1220 as indicated by attached electrical component 1230' shown in dashed line in a secured position on cable 1220. In some cases, the conductive bands 1208 are positioned to encompass some of the hook fastener elements 1202 of cable 1220, and where the electrical signal processing component 1230 is equipped with electrically conductive complementary fastening material, e.g., metallized loop material, an electrical signal can be transmitted between band 1208 of cable 1220 and electrical signal processing component 1230 by way of the releasably engaged complementary fastener elements 1202 and 1232.

Figure 39A:
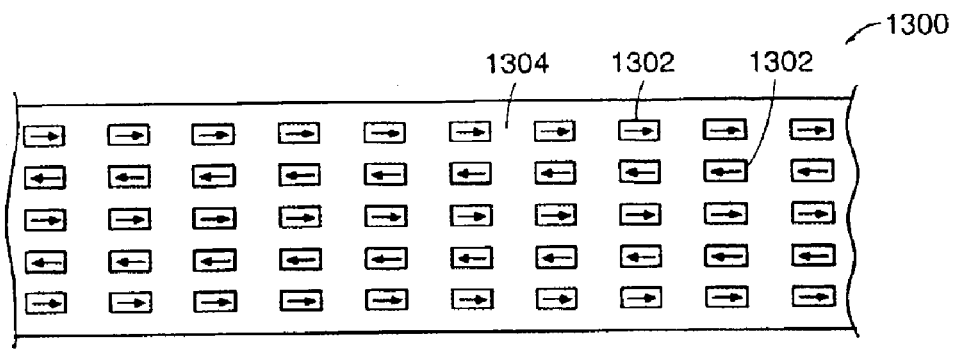
FIGS. 39A, 39B and 39C illustrate top, side and bottom views, respectively, of an alternative electrically conductive, hook fastener cable.
Figure 39B:
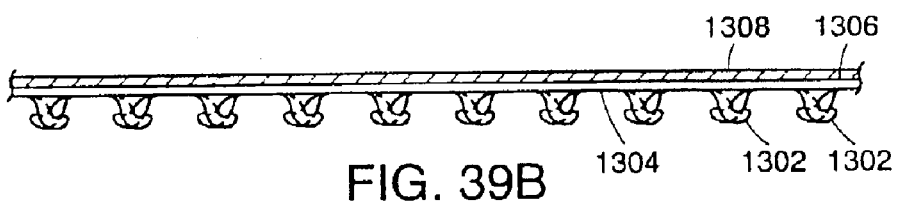
Figure 39C:
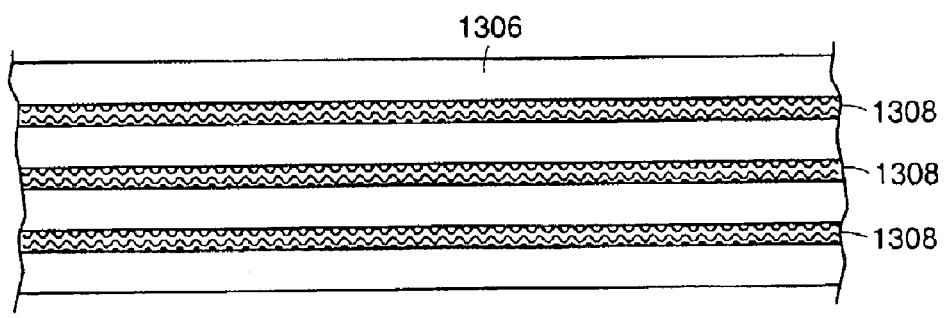

In the example illustrated in FIGS. 39A–39C, cable 1300 has hook fastener elements 1302 integrally formed and extending from broad surface 1304. Discrete strips 1308 of electrically conductive material are attached to and extend in continuous fashion along an opposite broad surface 1306 of cable 1300. Cable 1300 can be produced by the process described above with reference to FIG. 36 by manipulating the extruded, molded thermoplastic web so that its surface opposite the hook fastener elements is exposed to the conductive material application process. Use of an appropriately shaped mask allows the conductive material to be attached to the thermoplastic substrate as discrete strips 1308.

Figure 40A:
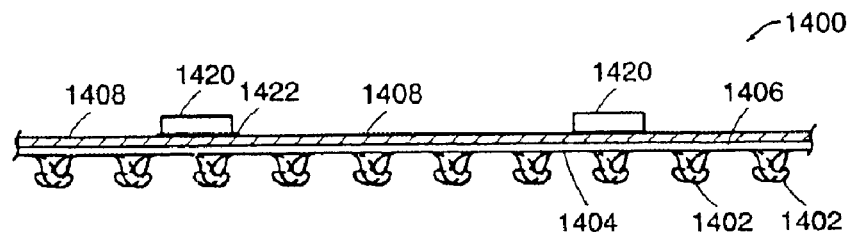
FIGS. 40A and 40B illustrate side and bottom views, respectively, of an alternative electrically conductive, hook fastener cable with attached electrical components.
Figure 40B:
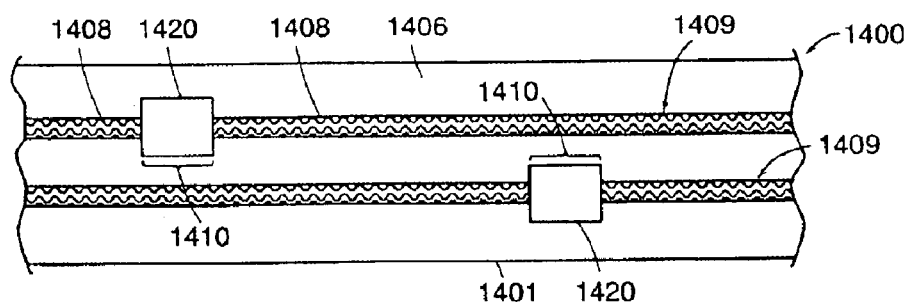

In the example illustrated in FIGS. 40A–40B, cable 1400 has discontinuous strips 1408 of electrically conductive material attached to a broad surface 1406 opposite the hook fastener element bearing surface 1404. The discontinuities 1410 can be of predetermined dimension, e.g., by appropriate mask design when cable 1400 is produced by the process illustrated in FIG. 36, so that electrical components 1420 can be subsequently attached, e.g. by soldering welds 1422, to bridge the discontinuity. The resulting hook fastener cable 1400 becomes a flexible carrier of one or more electrical components 1420 (i.e., cable 1400 is a flexible circuit board) and cable 1400 can be releasably secured to any surface having complementary loop or other hook fastener elements that are engageable with hook fasteners 1402.

Figure 41:
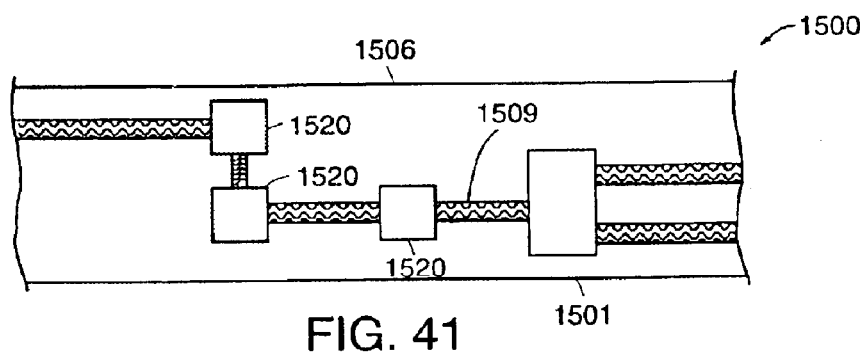
FIG. 41 illustrates a bottom view of an alternative electrically conductive, flexible hook fastener circuit with attached electrical components.

As illustrated in FIG. 41, various other patterns of electrically conductive tracks can be formed on the surface 1506 of a hook fastener cable 1500 so that electrical components 1520 can be attached to process and or modify electrical signals that pass through the cable. Again, the desired pattern of electrical conductive material can be attached by use of an appropriate mask design to form flexible circuit board 700.

Furthermore, the flexible circuits 1400 and 1500 of FIGS. 40A, 40B and 41 can be initially formed by any circuit forming method and without integral fasteners extending therefrom. The circuits (e.g., conductive paths 1409, 1509) can be on an exposed surface of a substrate (as shown) or can be embedded, e.g., electrically insulated, within a substrate 1401, 1501. Such flexible circuits can then be processed using one or more of the techniques described above to laminate a pre-formed hook or loop fastener element-bearing tape thereto or to simultaneously form and laminate thereto a hook element-bearing fastener tape. Also, if desired, the hook tape can be laminated and/or formed to simultaneously electrically insulate a previously exposed conductive path. Either prior to feeding the flexible circuit through the laminating/forming gap or after, insulating material can be removed (e.g., by the hole punching technique described above or by any other method) to expose portions of the conductive path 1409, 1509 for electrical connection to other electrical conduits and/or devices.

Figure 41A:
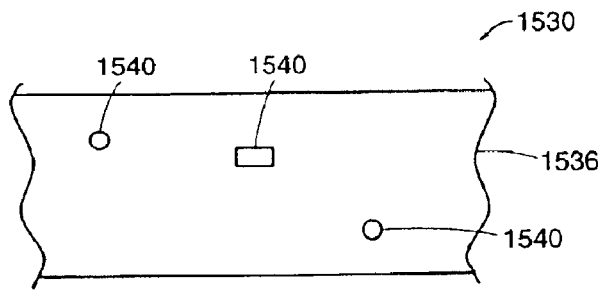
Figure 41B:
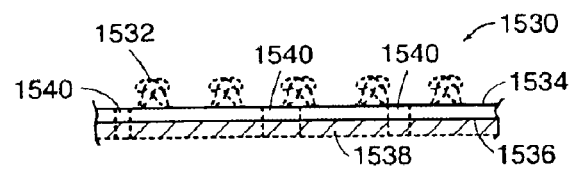
Figure 41C:
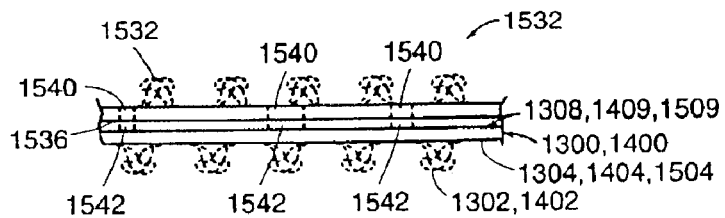
FIG. 41C illustrates a side view of a laminated flexible circuit product combining the backing film of FIGS. 41A and 41B with a cable/circuit of FIG. 39A, 39B or 40A, 40B, or 41.

Referring now also to FIGS. 41A, 41B and 41C, a second substrate 1530, e.g., a polyester film, is provided. Film 1530 defines a first 1534 and a second 1536, opposite broad surface and can be a flat substrate, or alternatively, can have integrally formed hook fastener elements 1532 (illustrated by dashed lines and formed as described above) protruding from first surface 1532. Film 1530 can be laminated to any of conductive path bearing substrates 1300, 1400 or 1500 in such a manner that the conductive path is disposed between the conductive path bearing surface, e.g., 1306, 1406, 1506 of substrate 1300, 1400, 1500 and the second surface 1536 of film 1530 thus producing flexible circuit product 1550 (FIG. 41C). Lamination of film 1530 over conductive path 1308, 1409, 1509, can be accomplished by any method, e.g., tradition methods such as adhesive 1538 (shown in dashed lines), thermal or ultrasonic bonding, and/or any other laminating technique including any described above.

In a particularly advantageous embodiment, portions 1540 of film 1530 are removed, e.g., by punching or piercing, at desired locations so that after lamination, portions 1542 of conductive path 1308, 1409, 1509 are accessible for, e.g., electrical connection(s). When adhesive is used in the lamination process, it is desirable that the adhesive 1538 be applied to surface 1536 of film 1530 prior to the removal, e.g., punching and/or piercing, process so that after lamination the adhesive does not interfere with electrical connection(s) to the exposed portions 1540 of conductive path 1308, 1409, 1509.

Figure 41D:
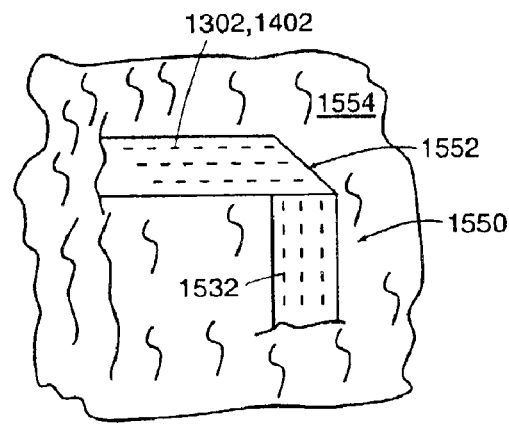
FIG. 41D illustrates the flexible circuit product of FIG. 41C releasably secured to a supporting surface.

As illustrated particularly in FIG. 41D, when film 1530 has hook fastener elements 1532 extending from first surface 1534 and conductive path bearing substrate 1300, 1400, 1500 likewise has hook fastener elements 1302, 1402 extending from its exposed surface 1304, 1404, 1504 the resulting laminate is a double sided hook bearing flexible circuit 1550. This is particularly advantageous because it allows for flat securement of the flexible circuit in an area requiring that the path of circuit securement change drastically, e.g., a 90° turn. This is accomplished by initially fastening hook fastener elements 1302, 1402 of substrate 1300, 1400, 1500 to mating elements (e.g., exposed loops) of a supporting surface 1554 and then folding the circuit upon itself (as illustrated at 1552) and attaching the hook fastener elements 1532 of film 1530 to supporting surface 1554 (or another supporting surface).

Figure 42:
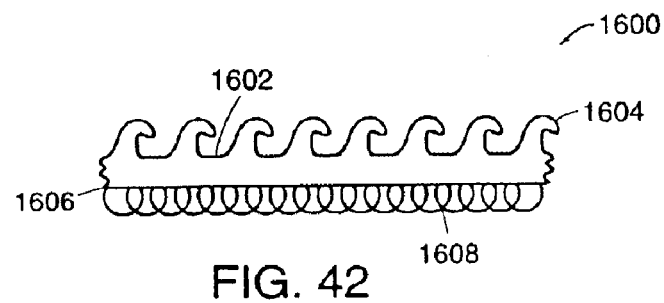
FIG. 42 illustrates a side view of an alternative electrically conductive hook fastener tape having a conductive, hook-engageable, loop material backing.

In one embodiment, illustrated in FIG. 42, a fastener product 1600 has a first surface 1602 with conductive coated hook fastener elements 1604 and an opposite second surface 1606 with conductive loop material 1608. Such a "back-to-back" conductive fastener product can be produced by a modification to the process described above with reference to FIG. 36. As indicated in dashed lines, a conductive loop material 1610 is fed from a roll 1612 into nip 1004 simultaneously with extruded resin 1000. An outer surface of loop material contacts pressure roll 1008 and an inner surface contacts molten resin 1000 as the resin is forced into hook-forming cavities 1010 of mold roll 1006. Pressure in the nips causes the inner surface of the loop material and the resin to become permanently bonded as the hooks are molded. Such a process and variations thereof are more fully described, for example, in U.S. Pat. No. 5,260,015 to Kennedy et al., issued Nov. 9, 1993, to which the reader is referred for further information.

One example of a conductive loop material 1610 suitable for use in producing back-to-back conductive fastener 1600 is a product marketed under the tradename HI-MEG BRAND Loop tape and available from Velcro U.S.A. Corp., Manchester, N.H. The conductive nature of at least the outer surface of loop material 1610 remains substantially unaffected by the temperatures of the molding process because the pressure roll is typically either unheated or cooled. Alternatively, loop material 1610 may be initially a noncoated, nonconductive loop material that is fed into nip 1004, and subsequently both the hook and loop surfaces of the resulting product can be conductively coated in a post-forming operation.

A number of embodiments of the invention have been described. Nevertheless, it will be understood that various modifications may be made without departing from the spirit and scope of the invention. For example, as an alternative to the masking process described above for producing a desired pattern of electrically conductive material on a hook fastener substrate, a removal process can be employed. Such a removal process can be implemented by first providing a hook fastener tape having one or both broad surfaces coated with a conductive layer as described above with reference to FIGS. 2 and 3 and subsequently removing selected portions of the conductive coating to leave a desired conductive pattern on the substrate. Removal can be achieved by, e.g., machining, grinding, or cutting the conductive material to remove it from the desired areas. Of course, electrical components (e.g., 1420 and 1520 as described above) can then be soldered or otherwise electrically connected in desired areas on the substrate.

Furthermore, and quite notably, many of the above described techniques can be combined to produce fasteners having combinations of the various described features as desired for the particular application of the resulting electricity conducting fastener. For example, the circuit printing techniques and resulting products described with reference to FIGS. 36–41 can be combined with the techniques described with reference to FIG. 9, 13, 19, 23 or 28. The result is to form a printed or otherwise deposited circuit pattern on a substrate (possibly a substrate already bearing fastener elements on an exposed surface opposite the circuit pattern), and to then form hook fastener elements, e.g., hooks, while simultaneously covering and insulating the otherwise exposed circuit pattern. The resulting product can have, for example, hooks on one or both major exposed surface, or hooks on one major exposed surface with loops on the opposite major exposed surface. Also, the piercing techniques described with reference to FIGS. 37A–37D can be employed to provide exposed areas of the otherwise insulated circuit pattern for, e.g., connecting power supply or other terminals and connections. Accordingly, other embodiments are within the scope of the following claims.

A number of embodiments of the invention have been described. Nevertheless, it will be understood that various modifications may be made without departing from the spirit and scope of the invention. Accordingly, other embodiments are within the scope of the following claims.

The entire contents of each of the references to which the reader has been referred to for further information above are hereby fully incorporated by reference.

What is claimed is:

1. A method of continuously forming an electrical cable, the method comprising:
   introducing an electrical insulating material comprising a thermoplastic resin into a gap formed adjacent a peripheral surface of a rotating mold roll, the mold roll defining an array of cavities therein, the insulating material being introduced under pressure and temperature conditions selected to cause the insulating material to at least partially fill the cavities to form fastener element stems integrally with and extending from one broad surface of a strip of said insulation material; while
   introducing at least two longitudinally continuous and spaced apart electrical conductors to the gap so as to cause the insulating material to envelop and electrically isolate the conductors and cause the conductors to become an integral part of the strip of insulation material from which the fastener element stems extend.

2. The method of claim 1 wherein the cavities of the mold roll are shaped to mold distal heads on said fastener element stems, said distal heads being shaped to overhang the broad surface of the strip of insulating material so as to be engageable with exposed loop fibers.

3. The method of claim 1 wherein each of said stems defines a tip portion, the method further comprising deforming said tip portion of a plurality of said stems to form engaging heads overhanging the broad side of the strip of insulating material, the engaging heads being shaped to be engageable with exposed loop fibers.

4. The method of claim 1 wherein the gap comprises a nip defined between the rotating mold roll and a counter-rotating pressure roll.

5. The method of claim 1 wherein the gap comprises a nip defined between the rotating mold roll and a counter-rotating mold roll, each of said rotating mold roll and said counter-rotating mold roll defining an array of cavities therein, the insulating material being introduced under pressure and temperature conditions selected to cause the insulating material to at least partially fill the array of cavities of each of said rotating and said counter-rotating mold roll to form fastener element stems integrally with and extending from each of opposite broad sides of the strip of said insulation material.

6. The method of claim 1 wherein the insulating material comprises a layer of thermoplastic resin and a film backing, the film backing carrying the electrical conductors on a surface thereof, the layer of thermoplastic resin being introduced to the gap directly adjacent the rotating mold roll, the film backing carrying the electrical conductors being introduced to the gap under pressure and temperature conditions which cause the film backing to become permanently bonded to the thermoplastic resin to envelop and electrically isolate the conductors.

7. The method of claim 1 wherein the insulating material comprises a first and a second film of thermoplastic resin, wherein the electrical conductors and the first and second films are introduced to the gap with the electrical conductors disposed between the first and the second film, said first film being introduced directly adjacent the rotating mold roll under temperature and pressure conditions that cause the first and second films to become permanently bonded to each other in a manner enveloping and electrically isolating the conductors.

8. The method of claim 1 further comprising downstream of the gap, longitudinally severing the electrical insulation material after solidification to form two electrical cables, each cable containing at least one said conductor.

9. A method of continuously forming an electrical cable, the method comprising:
   introducing molten resin into a gap formed adjacent a rotating mold roll, the mold roll having a peripheral surface defining an array of molding cavities therein, under pressure and temperature conditions selected to cause the resin to fill the mold cavities and form an array of fastener element stems integrally molded with and extending from a broad strip of resin; while
   simultaneously introducing a preformed electrical ribbon-type cable to the gap adjacent the mold roll, such that the broad strip of resin becomes permanently bonded to a broad side of the ribbon-type cable such that the fastener element stems are exposed.

10. A method of continuously forming an electrical cable, the method comprising:
   providing a fastener tape of continuous length, the fastener tape comprising a base and an array of loop-engageable fastener elements, the base being of thermoplastic resin and defining a first and a second, opposite, broad surface, the array of loop engageable fastener elements comprising protrusions of the thermoplastic resin of the first surface;
   providing a backing film of continuous length, the backing film defining a broad surface, the broad surface of the backing film being arranged to face the second broad surface of the fastener tape;

disposing a plurality of spaced apart electrical conductors of continuous length between the second broad surface of the fastener tape and the broad surface of the backing film; and passing the fastener tape, backing film and conductor through a nip defined in part by a roller defining recesses arranged to receive at least some of the protrusion, thereby permanently attaching the fastener tape to the backing film with the plurality of conductors enveloped therebetween to form a laminate, with the conductors being electrically isolated from one another and the received protrusions extending from one surface of the laminate.

11. The method of claim 10, wherein said step of permanently attaching the fastener tape to the backing film comprises disposing a layer of electrically insulating adhesive between the second broad surface of the fastener tape and the broad surface of the backing film to cause the layer of adhesive to electrically isolate the plurality of conductors from one another while permanently bonding the fastener tape to the backing film to envelop the plurality of conductors therebetween.

12. The method of claim 10, wherein said step of permanently attaching the fastener tape to the backing film comprises heat welding along locations between said conductors.

13. A method of forming an electrical cable, the method comprising:

introducing a strip of molten electrical insulation material into a gap formed adjacent a peripheral surface of a rotating roll; while introducing a continuous strip of loop material having hook-engageable fiber portion to the gap along the surface of the roll, under conditions selected to cause the loop material to become at least partially embedded in the electrical insulation material to permanently bond the loop material to the resin while leaving the hook-engageable fiber portions exposed for engagement; and introducing at least two longitudinally continuous and spaced apart electrical conductors to the gap so as to cause the insulating material to envelop and electrically isolate the conductors in the gap to form a multi-conductor electrical cable having engageable loops extending from an outer surface thereof.

14. A method of forming a flexible circuit board with integral hook fastener elements, the method comprising:

introducing an elongated flexible circuit including a substrate and at least one electrically conductive path to a gap adjacent a peripheral surface of a mold roll, the mold roll having hook fastener element stem forming cavities extending inwardly from said peripheral surface, while simultaneously, introducing a thermoplastic resin into said gap directly adjacent said peripheral surface under temperature and pressure conditions causing said thermoplastic resin to at least partially fill said stem forming cavities and to permanently bond to said substrate; and stripping the permanently joined thermoplastic resin and substrate from said mold roll to expose said fastener element stems.

15. The method of claim 14, wherein said conductive path is electrically insulated within said substrate prior to being introduced to the gap.

16. The method of claim 14, wherein a portion of said conductive path is exposed within the substrate for making an electrical connection with said conductive path.

17. The method of claim 16, wherein said portion of said conductive path is exposed prior to entering the gap.

18. The method of claim 16, wherein said portion of said conductive path is exposed by partial removal of the substrate after stripping the thermoplastic resin from the mold roll.

19. The method of claim 14, wherein said conductive path is disposed on an exterior surface of said substrate prior to being introduced to the gap, said thermoplastic resin being of an electrically insulating material, said conductive path being enveloped by said thermoplastic resin and said substrate.

20. The method of claim 14, wherein said conductive path is comprised of continuous strips of conductive material.

21. The method of claim 14, wherein said conductive path is comprised of discontinuous strips of conductive material that are electrically joined by electrical components.

* * * * *

UNITED STATES PATENT AND TRADEMARK OFFICE
CERTIFICATE OF CORRECTION

| | |
|---|---|
| PATENT NO. | : 6,977,055 B2 |
| APPLICATION NO. | : 10/423816 |
| DATED | : December 20, 2005 |
| INVENTOR(S) | : Christopher M. Gallant et al. |

It is certified that error appears in the above-identified patent and that said Letters Patent is hereby corrected as shown below:

On title page item (56) References Cited, FOREIGN PATENT DOCUMENTS, please add --GB 2275373 08/1994 --

Column 29, line 5, "conductor" should be -- conductors --.

Column 29, line 8, "protrusion" should be -- protrusions --.

Signed and Sealed this

Fourteenth Day of November, 2006

JON W. DUDAS
*Director of the United States Patent and Trademark Office*